United States Patent
Yamamoto

(10) Patent No.: US 7,675,377 B2
(45) Date of Patent: Mar. 9, 2010

(54) VOLTAGE CONTROLLED OSCILLATOR

(75) Inventor: Tomoaki Yamamoto, Atsugi (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 11/918,601

(22) PCT Filed: Nov. 29, 2006

(86) PCT No.: PCT/JP2006/323821

§ 371 (c)(1),
(2), (4) Date: Oct. 16, 2007

(87) PCT Pub. No.: WO2007/069455

PCT Pub. Date: Jun. 21, 2007

(65) Prior Publication Data

US 2009/0066433 A1 Mar. 12, 2009

(30) Foreign Application Priority Data

Dec. 15, 2005 (JP) .............................. 2005-361750

(51) Int. Cl.
*H03B 5/32* (2006.01)
(52) U.S. Cl. ................ 331/177 V; 331/158; 331/116 R
(58) Field of Classification Search ............. 331/116 R, 331/116 FE, 158, 116 M, 154, 155, 177 R, 331/177 V See application file for complete search history.

(56) References Cited

U.S. PATENT DOCUMENTS 5,764,112 A * 6/1998 Bal et al. ............... 331/116 FE
6,040,744 A * 3/2000 Sakurai et al. ............. 331/176
6,628,175 B1 * 9/2003 Guo et al. .................. 331/158

FOREIGN PATENT DOCUMENTS

| JP | 62-030410 | 2/1987 |
|---|---|---|
| JP | 02-203606 | 8/1990 |
| JP | 03-068203 | 3/1991 |
| JP | 07-273547 | 10/1995 |
| JP | 08-204451 | 8/1996 |
| JP | 10-051238 | 2/1998 |
| JP | 2003-282724 | 10/2003 |
| WO | WO 2005046046 A1 * | 5/2005 |

\* cited by examiner

*Primary Examiner*—Robert Pascal
*Assistant Examiner*—Ryan J. Johnson
(74) *Attorney, Agent, or Firm*—Finnegan, Henderson, Farabow, Garrett & Dunner, L.L.P.

(57) ABSTRACT

The present invention provides a voltage controlled oscillator having a wide frequency variation range and an oscillation frequency that shows favorable linearity with respect to control voltage. The present invention includes an amplifier circuit 21, a piezoelectric element 22 connected in parallel to the amplifier circuit 21 and forming a feedback loop, variable capacitive elements 24 and 25 respectively connected to an input terminal and an output terminal of the amplifier circuit 21 and having a capacitance value that is dependent on control voltage, and an analog operation circuit 26 that generates a control voltage Vcs based on an inputted control voltage Vc. In this arrangement, the control voltage Vc is applied to the variable capacitive element 24 and the control voltage Vcs generated by the analog operation circuit 26 is applied to the variable capacitive element 25.

19 Claims, 17 Drawing Sheets

F I G. 14

| CONTROL VOLTAGE Vc (V) | FOLLOWING CONTROL VOLTAGE Vcs (V) |
|---|---|
| 0.00 | −0.30 |
| 0.10 | −0.13 |
| 0.20 | 0.03 |
| 0.30 | 0.20 |
| 0.40 | 0.37 |
| 0.50 | 0.53 |
| 0.60 | 0.70 |
| 0.70 | 0.87 |
| 0.80 | 1.03 |
| 0.90 | 1.20 |
| 1.00 | 1.37 |
| 1.10 | 1.53 |
| 1.20 | 1.70 |
| 1.30 | 1.87 |
| 1.40 | 2.03 |
| 1.50 | 2.20 |
| 1.60 | 2.37 |
| 1.70 | 2.53 |
| 1.80 | 2.70 |
| 1.90 | 2.87 |
| 2.00 | 3.03 |
| 2.10 | 3.20 |
| 2.20 | 3.37 |
| 2.30 | 3.53 |
| 2.40 | 3.70 |
| 2.50 | 3.87 |
| 2.60 | 4.03 |
| 2.70 | 4.20 |
| 2.80 | 4.37 |
| 2.90 | 4.53 |
| 3.00 | 4.70 |

Prior Art

VOLTAGE CONTROLLED OSCILLATOR

TECHNICAL FIELD

The present invention relates to a voltage controlled oscillator which uses variable capacitive elements with capacitance values that change according to a control voltage as a load capacitance for a piezoelectric element, and in particular to a voltage controlled oscillator which has a wide variable range of frequencies and a substantially improved linearity of a oscillation frequency with respect to a variable capacitance control voltage.

The present invention also relates to a method for generating a control voltage applied to such a voltage controlled oscillator.

BACKGROUND ART

Voltage controlled oscillators utilizing piezoelectric elements have been widely used as frequency signal sources in various communications devices and other electronic devices.

Moreover, voltage controlled oscillators utilizing, as a load capacitance of the piezoelectric element, at least one variable capacitive element whose capacitance value varies according to a DC control voltage have been used to suppress frequency differences over a wide range of usage temperatures, to synchronize a frequency to a reference frequency, and the like.

In this type of voltage controlled oscillator, a wide range of frequency variation and linearity of oscillation frequency with respect to control voltage are desirable. Specifically, in order to improve the linearity of oscillation frequency with respect to control voltage, it is necessary to ensure that the load capacitance is linear with respect to the control voltage.

The devices described in patent document 1 and patent document 2 are known voltage controlled oscillators of this type.

As shown in FIG. 17, the voltage controlled oscillator described in patent document 1 includes a CMOS inverter 1, a quartz oscillator 2 connected in parallel between the input and output terminals of the CMOS inverter 1 to form a feedback loop, a resistor 3 forming a feedback loop, fixed capacitors 4 and 5 respectively connected to input and output sides of the CMOS inverter 1, a variable capacitance element 6 with a capacitance value that changes according to an applied control voltage Vc and is connected in series with the fixed capacitor 4 on the input side of the CMOS inverter 1, and a bias-use resistor 7.

In this type of voltage controlled oscillator the oscillation frequency generated using the quartz oscillator 2 is varied by causing the capacitance value of the variable capacitive element 6 connected on the input side of the CMOS inverter 1 to vary using the control voltage Vc.

As shown in FIG. 18, the voltage controlled oscillator described in patent document 2 includes an amplifier circuit 11, a piezoelectric element 12 that is connected in parallel between an input terminal and an output terminal of the amplifier circuit 11 and forms a feedback loop, a resistor 13 that forms a feedback loop, variable capacitive elements (varicap) 14 and 15 respectively connected to the input and output sides of the amplifier circuit 11 and each having a capacitance value that changes according to an applied control voltage Vc, and a frequency-adjustment voltage generating circuit 16 that generates the control voltage Vc.

In the voltage controlled oscillator with this type of construction, the oscillation frequency generated using the piezoelectric element 12 is varied by changing the capacitance values of the variable capacitive elements 14 and 15 that are connected to respective terminals of the piezoelectric element 12. The control voltage Vc is generated by the frequency-adjustment voltage generating circuit 16, using as the load capacitance the variable capacitive elements 14 and 15 with the capacitance value that changes according to the control voltage Vc.

[Patent Document 1] JP2003-282724A
[Patent Document 2] JP10-51238A

As shown in FIGS. 17 and 18, forms of the voltage controlled oscillator having at least one variable capacitive element include a form in which a single variable capacitive element connects to a terminal on one of the input and output sides of the amplifier circuit and a fixed capacitor connects to the other terminal, and a form in which a variable capacitive element is connected each of the two terminals of the amplifier circuit.

For both forms, a load capacitance CL that determines the oscillation frequency is a series capacitance of an input-side capacitance Cin and an output-side capacitance Cout. The series capacitance is expressed below in equation (1).

$$CL=(Cin \times Cout)/(Cin+Cout) \tag{1}$$

The following is a discussion of a variable range of the oscillation frequency for the voltage controlled oscillators shown in FIG. 17 and FIG. 18.

As shown in FIG. 17, in the form in which the variable capacitive element connects to the terminal on one of the input and output sides of the amplifier circuit, the above-described load capacitance is a combined capacitance that includes the capacitance of the variable capacitive element connected to one of the input-terminal or the output-side terminal of the amplifier circuit and the capacitance of fixed capacitor connected to the other terminal.

As shown in FIG. 18, in the form in which a variable capacitive element connects to both terminals of the amplifier circuit, the above-described load capacitance is a combined capacitance that includes the capacitance of the variable capacitive element connected to the input-side terminal and the capacitance of the variable capacitive element connected to the output-side terminal.

Thus, from equation (1) it is clear that the amount of change in load capacitance will be greater in the latter form.

Therefore, in the form, shown in FIG. 18, in which variable capacitive elements are attached to both the input and output-side terminals of the amplifier circuit, an achievable oscillation frequency range is wider than in the form, shown in FIG. 17, in which the variable capacitive element is used only on one side.

The following is a discussion of the linearity of the change in oscillation frequency with respect to control voltage in the voltage controlled oscillators shown in FIG. 17 and FIG. 18.

As described above, the oscillation frequency is determined by the load capacitance. Hence, to have linearity in the change in oscillation frequency with respect to control voltage, it is necessary to have linearity in the change in load capacitance with respect to control voltage.

FIG. 19 shows an example of the changes in input and output-side capacitances with respect to control voltage for the form in which the variable capacitive element connects, as shown in FIG. 17, to one of the input-side and output-side terminals of the amplifier circuit.

The capacitance of the variable capacitive element changes according to the control voltage, but the fixed capacitance is constant and independent of the control voltage. The change in the load capacitance, which is the combined capacitance calculated using equation (1), with respect to the control voltage is shown in FIG. 20. As is clear from FIG. 20, in a region where the change in capacitance begins, the change in the load capacitance is large, but in a region where the change in capacitance ends, the change in load capacitance becomes smaller. In short, the change in load capacitance with respect to control voltage is non-linear.

In the other form, in which variable capacitive elements are used at both the input and output terminal of the amplifier circuit as shown in FIG. 18, a central operating voltage and an amplitude of a oscillated wave form differ at the input-side terminal and output-side terminal of the amplifier circuit. Hence, the change in capacitance of the variable capacitive element with respect to the control voltage is different on the input and output sides.

Thus, an input voltage range over which the change in capacitance occurs in the variable capacitive element connected to the terminal where the amplitude of the oscillation wave form is large, is larger than a section over which the change in capacitance occurs in the variable capacitive element connected to the terminal where the amplitude of the oscillation wave form is small. A smallest value and a largest value of the oscillation wave form vary according to differences in the central operating voltage and the amplitude of the oscillation wave form. Hence, the control voltage at which the change in capacitance begins and the control voltage at which the change in capacitance ends differ between sides.

Generally, in an oscillator of the type shown in FIG. 18, the oscillation wave form on the output side has a higher central operating voltage than the wave form on the input side. Also, the change in the capacitance of the variable capacitive elements on the input and output sides with respect to the control voltage when the amplitude is large, is as illustrated in FIG. 21. The change in the capacitance begins at a higher control voltage in the output-side variable capacitive element than in the input-side variable capacitive element. Moreover, the range of control voltage over which the change in the capacitance occurs is larger.

In this case linearity of the change in the load capacitance with respect to the control voltage is poor, as shown in FIG. 22.

Thus, in conventional voltage controlled oscillators that use variable capacitive elements, obtaining a wide frequency variation range and making the change of oscillation frequency linear with respect to the control voltage are problems.

The object of the present invention is solve these problems by providing a voltage controlled oscillator having a wide frequency variation range and an oscillation frequency that shows favorable linearity with respect to control voltage.

DISCLOSURE OF THE INVENTION

The present invention is a voltage controlled oscillator including an amplifier circuit; a piezoelectric element that is connected between an input terminal and an output terminal of the amplifier circuit and forms a feedback loop; first and second variable capacitive elements with capacitance values that change according to a control voltage respectively connected to the input terminal and the output terminal; and an analog operation circuit that generates a desired control voltage based on an inputted control voltage and applies the desired control voltage to at least one of the first and second variable capacitive elements, wherein the analog operation circuit has a multiplicative gain and generates an offset potential difference.

As an aspect of the present invention, the inputted control voltage may be applied to one of the first and second variable capacitive elements, and the desired control voltage generated by the analog operation circuit may be applied to the other of the first and second variable capacitive elements.

As an aspect of the present invention, the analog operation circuit may include a first analog operation circuit that generates a desired first control voltage based on the inputted control voltage and a second analog operation circuit that generates a desired second control voltage based on the inputted control voltage, and the first control voltage may be applied to one of the first and second variable capacitive elements and the second control voltage may be applied to the other of the first and second variable capacitive elements.

As an aspect of the present invention, the analog operation circuit may include a third analog operation circuit that generates a desired third control voltage based on the inputted control voltage and a fourth analog operation circuit that generates a desired fourth control voltage based on the third control voltage, and the third control voltage may be applied to one of the first and second variable capacitive elements and the fourth control voltage may be applied to the other of the first and second variable capacitive elements.

As an aspect of the present invention, when the inputted control voltage varies in a range of $\pm V1$ from a reference voltage $Vc1$ and the desired control voltage varies in a range of $\pm V2$ from a reference voltage $Vc2$, the gain of the analog operation circuit may be $V2/V1$ and the offset potential difference may be $(Vc2-Vc1)$.

As an aspect of the present invention, when the inputted control voltage varies in a range of $\pm V1$ from a reference voltage $Vc1$, the first control voltage varies in a range of $\pm V5$ from a reference voltage $Vc5$, and the second control voltage varies in a range of $\pm V6$ from a reference voltage $Vc6$, in the first analog operation circuit the gain may be $V5/V1$ and the offset potential difference may be $(Vc5-Vc1)$ and in the second analog operation circuit the gain may be $V6/V1$ and the offset potential difference may be $(Vc6-Vc1)$.

As an aspect of the present invention, when the inputted control voltage varies in a range of $\pm V1$ from a reference voltage $Vc1$, the third control voltage varies in a range of $\pm V7$ from a reference voltage $Vc7$, and the fourth control voltage varies in a range of $\pm V8$ from a reference voltage $Vc8$, in the third analog operation circuit the gain may be $V7/V1$ and the offset potential difference may be $(Vc7-Vc1)$ and in the fourth analog operation circuit the gain may be $V8/V7$ and the offset potential difference may be $(Vc8-Vc7)$.

As an aspect of the present invention, when the oscillation amplitude at the input terminal is $V3$, the oscillation amplitude at the output terminal is $V4$, a central operating voltage at the input terminal is $Vc3$, and a central operating voltage at the output terminal is $Vc4$, in the analog operation circuit the gain may be $V4/V3$ and the offset potential difference may be $(Vc4-Vc3)$.

As an aspect of the present invention, when the oscillation amplitude at the input terminal is $V3$, the oscillation amplitude at the output terminal is $V4$, a central operating voltage at the input terminal is $Vc3$, and a central operating voltage at the output terminal is $Vc4$, a ratio of the gain in the first analog operation circuit and the gain in the second analog operation circuit may be $V4/V3$ and a difference between the offset potential difference of the first analog operation circuit and the offset potential difference in the second analog operation circuit may be $(Vc4-Vc3)$.

As an aspect of the present invention, when the oscillation amplitude at the input terminal is $V3$, the oscillation amplitude at the output terminal is $V4$, a central operating voltage at the input terminal is $Vc3$, and a central operating voltage at the output terminal is Vc4, in the fourth analog operation circuit the gain may be V4/V3 and the offset potential difference may be (Vc4−Vc3).

As an aspect of the present invention, the analog operation circuit may generate the desired control voltage so that a change in capacitance value of the first variable capacitive element with respect to the inputted control voltage matches a change in capacitance value of the second variable capacitive element with respect to the inputted control voltage.

As an aspect of the present invention, the analog operation circuit may generate the desired control voltage so that a beginning point for the change in the capacitance value of the first variable capacitive element with respect to the inputted control voltage matches a beginning point for the change in the capacitance value of the second variable capacitive element with respect to the inputted control voltage, and an end point for the change in the capacitance value of the first variable capacitive element with respect to the inputted control voltage matches an end point for the change in the capacitance value of the second variable capacitive element with respect to the inputted control voltage.

As an aspect of the present invention, a change in a combined capacitance value that includes the capacitance value of the first variable capacitive element and the capacitance value of the second variable capacitive element may be linear with respect to the inputted control voltage.

As an aspect of the present invention, the gain and the offset potential difference of the analog operation circuit may be alterable.

As an aspect of the present invention, when the analog operation circuits are ICs, the gain and the offset potential difference of the analog operation circuit may be set to different values in each IC.

As an aspect of the present invention, the amplifier circuit, the first and second variable capacitive elements, and the analog operation circuit may be formed on a same substrate and built into an IC.

As an aspect of the present invention, the piezoelectric element may be a surface acoustic wave piezoelectric element.

As an aspect of the present invention, the voltage controlled oscillator may further include a voltage measuring unit operable to measure the respective voltages at the input terminal and the output terminal; and a control unit operable to control the gain and the offset potential difference of the analog operation circuit based on both of the measured voltages.

The present invention is a method for generating and applying a control voltage for a voltage controlled oscillator that includes an amplifier circuit, a piezoelectric element that is connected between an input terminal and an output terminal of the amplifier circuit and forms a feedback loop, and first and second variable capacitive elements with capacitance values that change according to the control voltage respectively connected to the input terminal and the output terminal, the method including steps of: generating a desired control voltage based on the inputted control voltage so that the change in capacitance value in the first variable capacitive element with respect to the inputted control voltage matches the change in capacitance value in the second variable capacitive element with respect to the inputted control voltage, and applying the generated desired control voltage to the at least one of the first and second variable capacitive elements.

As an aspect of the present invention, a change in a combined capacitance value that includes the capacitance value of the first variable capacitive element and the capacitance value of the second variable capacitive element may be linear with respect to the inputted control voltage during the operation of the voltage controlled oscillator.

The present invention is also a method for designing a voltage controlled oscillator including an amplifier circuit; a piezoelectric element that is connected between an input terminal and an output terminal of the amplifier circuit and forms a feedback loop; first and second variable capacitive elements with capacitance values that change according to a control voltage respectively connected to the input terminal and the output terminal; and an analog operation circuit that generates a desired control voltage based on an inputted control voltage and applies the desired control voltage to at least one of the first and second variable capacitive elements, the method including: a steps of measuring respective voltage values at the input and output terminals; a step of determining a desired control voltage so that the change in capacitance value in the first variable capacitive element with respect to the inputted control voltage matches the change in capacitance value in the second variable capacitive element with respect to the inputted control voltage, based on both of the measured voltage values; and a step of setting values of gain and offset potential difference in the analog operation circuit so that the analog operation circuit generates the desired control voltage.

As an aspect of the present invention, the change in a combined capacitance value that includes the capacitance value of the first variable capacitive element and the capacitance value of the second variable capacitive element is linear with respect to the inputted control voltage.

In a voltage controlled oscillator of the present invention having this type of construction, since different control voltages are applied to the respective variable capacitive elements on the input side and the output side according to the difference in the central operating voltage and the difference in the oscillation amplitude at the input-side terminal and the output-side terminal of the amplifier circuit, the changes in capacitance in the variable capacitive elements with respect to control voltage on the input side can be made to match the change in capacitance with respect to control voltage on the output side. As a result, the load capacitance can be made to vary linearly with respect to the control voltage.

Also, by increasing the offset potential difference between the voltages applied to the respective variable capacitive elements on the input and output sides, it is possible to adjust a rate of change of frequency with respect to control voltage while retaining linearity in the change in capacitance with respect to control voltage.

BRIEF DESCRIPTION OF THE DRAWINGS

FIG. 11A shows the wave form during oscillation at the input-side terminal; FIG. 11B shows the wave form during oscillation at the output-side terminal;

FIG. 14 shows an example of a relationship between the control voltage and a following control voltage;

BEST MODE FOR CARRYING OUT THE INVENTION

The following describes embodiments of the present invention with reference to the drawings.

First Embodiment

A construction of a first embodiment of a voltage controlled oscillator of the present invention is described below with reference to FIG. 1.

Figure 1:
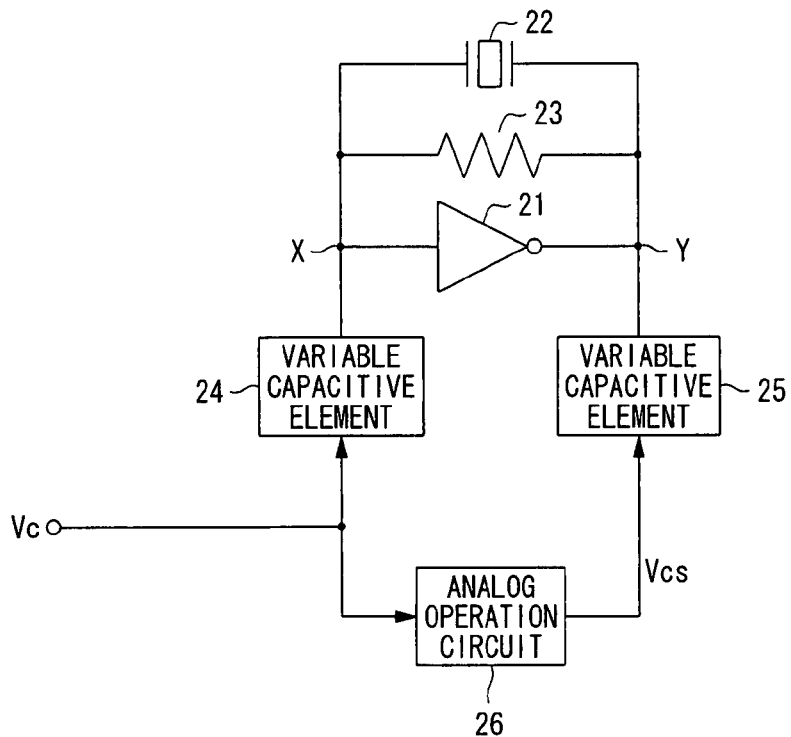
FIG. 1 shows a construction of a first embodiment of the present invention.

The voltage controlled oscillator of the first embodiment includes, as shown in FIG. 1, an amplifier circuit 21, a piezoelectric element 22 connected in parallel between an input terminal and an output terminal of the amplifier circuit 21 and forming a feedback loop, a resistor 23 forming a feedback loop, variable capacitive elements 24 and 25 respectively connected to the input terminal and the output terminal of the amplifier circuit 21 and each having a capacitance value that varies according to an applied control voltage, and an analog operation circuit 26. The piezoelectric element 22 is a device such as a surface acoustic wave piezoelectric element, a crystal resonator, or a ceramic resonator.

Here, the amplifier circuit 21, the variable capacitive elements 24 and 25, the analog operation circuit 26 and the like may formed on a same substrate as part of an IC. The above-described construction is substantially the same in each of the following embodiments.

In the first embodiment, a control voltage Vc is applied to the variable capacitive element 24 to change the capacitance value of the variable capacitive element 24, and a desired following control voltage (hereinafter control voltage) Vcs that follows the control voltage Vc is generated based on the control voltage Vc by the analog operation circuit 26, and applied to the variable capacitive element 25 to change the capacitance value of the variable capacitive element 25.

Any circuit construction is acceptable for the analog operation circuit 26 of the first embodiment provided that the circuit receives the control voltage Vc as an input and outputs the desired control voltage Vcs, which differs from the control voltage Vc.

Figure 2:
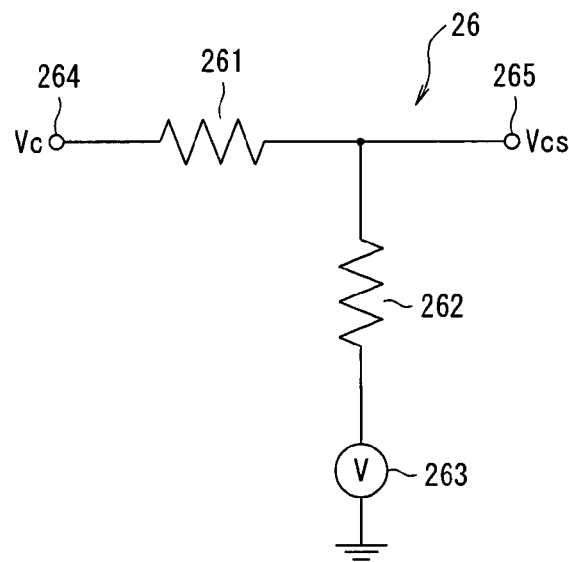
FIG. 2 shows an example construction of an analog operation circuit.

FIG. 2 shows an implementation of the analog operation circuit 26. The analog operation circuit 26 includes a resistor 261, a resistor 262, a DC power source 263, an input terminal 264, and an output terminal 265. Terminals of the resistor 261 respectively connect to the input terminal 264 and the output terminal 265. The resistor 262 and the DC power source 263 are connected in series, with one end connected to the output terminal 265 and the other end connected to ground.

In the analog operation circuit 26 of this construction, it is possible to obtain the desired control voltage Vcs, which differs from the control voltage Vc inputted to the input terminal 264, from the output terminal 265 by altering a portion or all of the values of the resistor 261, the resistor 262 and the DC power source 263.

Figure 3:
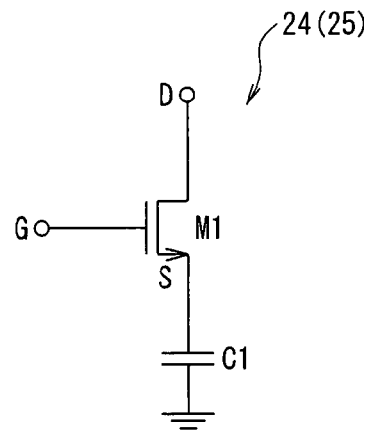
FIG. 3 shows an example construction for a variable capacitive element.

FIG. 3 shows an example construction of the variable capacitive element 24 and the variable capacitive element 25 used in the first embodiment.

The variable capacitive elements 24 and 25 are each formed using a MOS transistor M1 and include a capacitor C1. When the MOS transistor M1 is used as the variable capacitive element 24 or the variable capacitive element 25, a drain terminal is connected to an input terminal or an output terminal of the amplifier circuit 21.

A source terminal of the MOS transistor M1 is connected to ground via the capacitor C1. When the MOS transistor M1 is used as the variable capacitive element 24 or the variable capacitive element 25, the control voltage Vcs from the analog operation circuit 26 or the control voltage Vc is applied to a gate terminal.

In the variable capacitive element 24 of this construction, the capacitance value changes according to the control voltage Vc applied to the gate terminal of the MOS transistor M1. In the variable capacitive element 25, on the other hand, the capacitance value varies according to the control voltage Vcs from the analog operation circuit 26 applied to the gate terminal of the MOS transistor M1.

When a connection method of the type shown in FIG. 3 is used, the change in capacitance of the variable capacitive elements 24 and 25 with respect to the control voltage applied to the gate terminal is positive in polarity. Thus, as the control voltage applied to the gate terminal increases, the capacitance value of the variable capacitive element in question grows larger.

Second Embodiment

A construction of a second embodiment of a voltage controlled oscillator of the present invention is described below with reference to FIG. 4.

Figure 4:
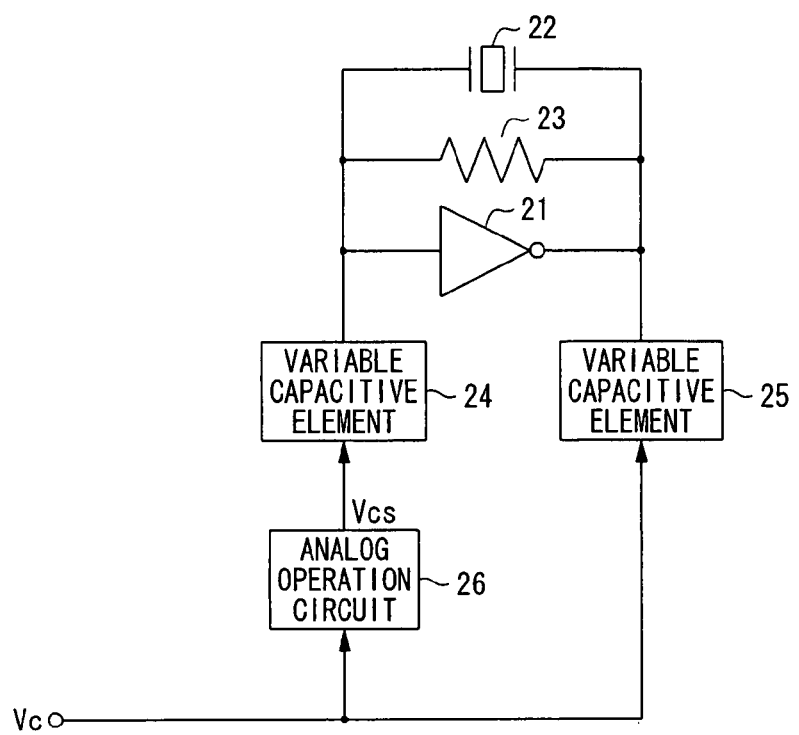
FIG. 4 shows a construction of a second embodiment of the present invention.

The voltage controlled oscillator of the second embodiment includes, as shown in FIG. 4, the amplifier circuit 21, the piezoelectric element 22 connected in parallel between the input terminal and the output terminal of the amplifier circuit 21 to form a feedback loop, the resistor 23 that forms a feedback loop, the variable capacitive elements 24 and 25 respectively connected to the input terminal and the output terminal of the amplifier circuit 21 and each having a capacitance value that varies according to the applied control voltage, and the analog operation circuit 26.

In the second embodiment, the control voltage Vc is applied to the variable capacitive element 25 to change the capacitance value of the variable capacitive element 24, and the control voltage Vcs is generated by the analog operation circuit 26 based on the control voltage Vc and applied to the variable capacitive element 24 to change the capacitance value of the variable capacitive element 24.

Thus, the difference between the first and second embodiments is in that the control voltage Vc is switched from being applied to the variable capacitive element 24 in the first embodiment to being applied to the variable capacitive element 25 in the second, and the control voltage Vcs from the analog operation circuit 26 is switched accordingly from being applied to the variable capacitive element 25 to being applied to the variable capacitive element 24.

Otherwise, the other constructions of the second embodiment are the same as the first embodiment, and either of the implementations shown in FIG. 2 and FIG. 3 can be used.

Third Embodiment

A construction of a third embodiment of the voltage controlled oscillator of the present invention is described below with reference to FIGS. 5A and 5B.

Figure 5A:
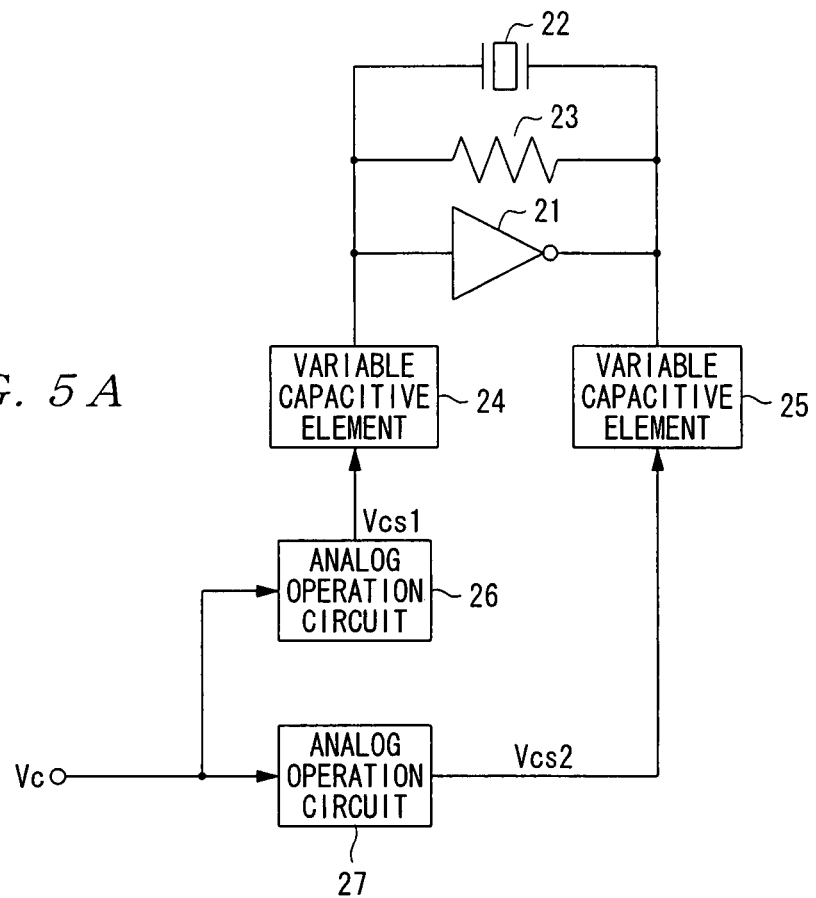
FIG. 5 shows a construction of a third embodiment of the present invention.
Figure 5B:
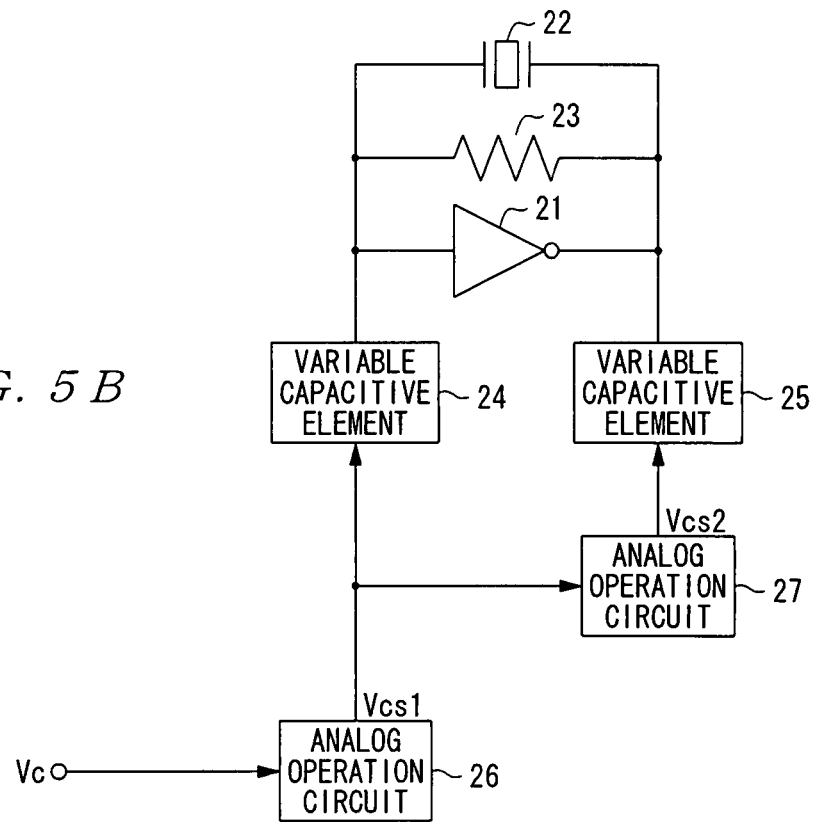

The voltage controlled oscillator of the third embodiment includes, as shown in FIGS. 5A and 5B, the amplifier circuit 21, the piezoelectric element 22 connected in parallel between the input terminal and the output terminal of the amplifier circuit 21 to form a feedback loop, the resistor 23 that forms a feedback loop, the variable capacitive elements 24 and 25 respectively connected to the input terminal and the output terminal of the amplifier circuit 21 and each having a capacitance value that varies according to the applied control voltage, and analog operation circuits 26 and 27 having different functions (operations).

In the third embodiment, as shown in FIG. 5A, the analog operation circuit 26 generates a prescribed control voltage (hereinafter control voltage) Vcs1, which follows the control voltage Vc, based on the control voltage Vc, and applies the generated control voltage Vcs1 to the variable capacitive element 24 to change the capacitance value of the variable capacitive element 24. The analog operation circuit 27 generates a desired control voltage (hereinafter control voltage) Vcs2 based on the control voltage Vc, and applies the generated control voltage Vcs2 to the variable capacitive element 25 to change the capacitance value of the variable capacitive element 25.

As shown in FIG. 5B, the analog operation circuit 26 generates the desired control voltage Vcs1, which follows the control voltage Vc, based on the control voltage Vc, and applies the generated control voltage Vcs1 to the variable capacitive element 24 to change the capacitance value of the variable capacitive element 24. The analog operation circuit 27 generates the desired control voltage Vcs2, which follows the control voltage Vcs1, based on the control voltage Vcs1 which is generated in the analog operation circuit 26, and applies the generated control voltage Vcs2 to the variable capacitive element 25 to change the capacitance value of the variable capacitive element 25.

Here, in the third embodiment, the analog operation circuits 26 and 27 are constructed in the same way as the analog operation circuit 26 in the first embodiment, and the implementation shown in FIG. 2 is applicable. The variable capacitive elements 24 and 25 in the third embodiment are constructed in the same as the variable capacitive elements 24 and 25 in the first embodiment, and the implementation shown in FIG. 3 is applicable.

Fourth Embodiment

A construction of a fourth embodiment of the voltage controlled oscillator of the present invention is described below.

The voltage controlled oscillator of the fourth embodiment is an arrangement of any of the first to third embodiments in which the analog operation circuit 26 or the analog operation circuit 27 constructed from an analog operation circuit having a non-zero multiplicative gain.

Other portions in the construction of the fourth embodiment, are substantially the same as in the first to third embodiments, and so a description of these other portions is omitted.

Figure 6:
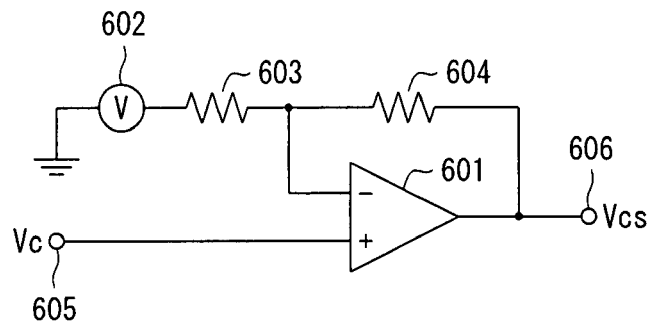
FIG. 6 shows an example construction of an analog operation circuit used in a fourth embodiment and in a fifth embodiment of the present invention.

FIG. 6 is an example construction of the above-described analog operation circuit of the fourth embodiment.

The analog operation circuit of FIG. 6 is a non-inverting amplifier circuit that includes a differential operational amplifier circuit (operational amplifier) 601, a DC power source 602, a resistor 603, and a resistor 604, and it is possible to change the gain of the circuit using a ratio between values of the resistor 603 and the resistor 604. With this arrangement a DC voltage is applied by the DC power source 602.

Specifically, the + input terminal of the differential operational amplifier circuit 601 is connected to an input terminal 605, and the control voltage Vc is applied to the input terminal 605. The DC power source 602 and the resistor 603 are connected in series. The terminal at one end of the series circuit connects to ground, and the terminal at the other end connects to the − input terminal of the differential operational amplifier circuit 601. The resistor 604 is connected between the − input terminal and the output terminal of the differential operational amplifier circuit 601, and the output terminal of the differential operational amplifier circuit 601 is connected to an output terminal 606. The control voltage Vcs is outputted from the output terminal 606.

Any circuit construction is acceptable for the analog operation circuit of the fourth embodiment provided that the circuit has a non-zero multiplicative gain (control voltage Vcs/control voltage Vc).

Fifth Embodiment

A construction of a fifth embodiment of the voltage controlled oscillator of the present invention is described below.

The voltage controlled oscillator of the fifth embodiment is the arrangement of any of the first to third embodiments, in which the analog operation circuit 26 or the analog operation circuit 27 constructed from an analog operation circuit that has a non-zero multiplicative gain and generates an offset potential difference between central operating voltages of input and output voltages.

Note that other portions in the construction of the fifth embodiment are substantially the same as in the first to third embodiments, and so a description of these other portions is omitted.

In the analog operation circuit of the fifth embodiment, the offset potential difference between the central operating voltages of the input and output voltages can be generated by a method of, for instance, the DC power source 602 in FIG. 6 applying a voltage that differs from the central operating voltage of the input voltage.

Any circuit construction is acceptable for the analog operation circuit of the fifth embodiment provided that the circuit has a non-zero multiplicative gain, and an offset potential difference between the central operating voltages of the input and output voltages.

Sixth Embodiment

A construction of a sixth embodiment of the voltage controlled oscillator of the present invention is described below.

The voltage controlled oscillator of the sixth embodiment is the arrangement of any of the first to fifth embodiments, in which the analog operation circuit 26 or the analog operation circuit 27 made up of one or more resistors and one or more amplifier circuits.

Other portions of the sixth embodiment are of substantially the same construction as in the first to fifth embodiments, and so a description of these other portions is omitted.

The analog operation circuit of the sixth embodiment is not limited to circuit constructions of the type shown in FIG. 6. Any construction is acceptable provided that one or more resistors and one or more amplifier circuits are used. For instance, a construction of the type shown in FIG. 7 may be used.

Figure 7:
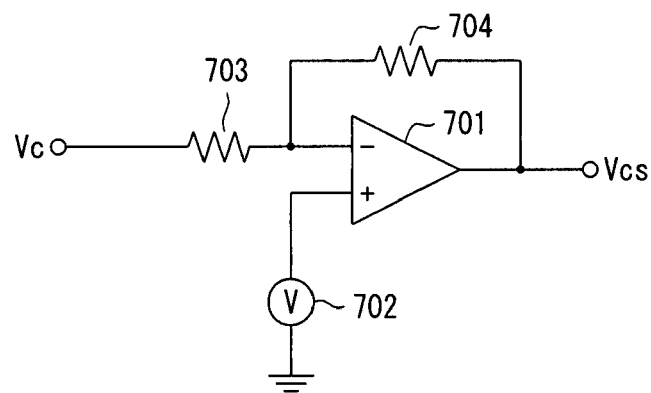
FIG. 7 shows an example construction of an analog operation circuit used in a sixth embodiment of the present invention.

FIG. 7 shows an example construction of the analog operation circuit of the sixth embodiment.

The analog operation circuit of FIG. 7 is an inverting amplifier circuit that includes a differential operational amplifier circuit 701, a DC power source 702, a resistor 703, and a resistor 704. A gain of the circuit can be changed using a ratio between a value of the resistor 703 and a value of the resistor 704, and it is possible to adjust an offset voltage difference between an input voltage and an output voltage by means of the voltage value of the DC power source 702.

In this analog operation circuit, if the resistor 703 is denoted R1 and the resistor 704 is denoted R2, the gain is −(R2/R1), and the polarities of the input voltage and the output voltage are different. Hence, it is necessary to reverse the polarity of the change in capacitance with respect to control voltage in the variable capacitive elements on the input and output sides of the amplifier circuit.

Figure 8:
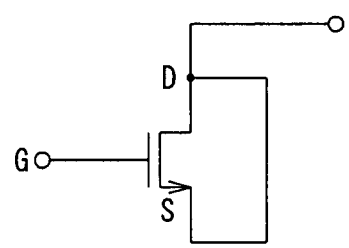
FIG. 8 shows an example of a different construction for a variable capacitive element.

For instance, when a variable capacitive element of the type shown in FIG. 8 is used, one method for connecting a variable capacitive element to the input or output side of the amplifier circuit is to connect the gate terminal in FIG. 8 to the amplifier circuit side terminal and apply the control voltage to a common source-drain terminal. With this method, the change in capacitance with respect to control voltage is positive. The method for connecting the other variable capacitive element is to connect the common source drain terminal to the amplifier circuit side terminal and apply the control voltage to the gate terminal. With this method, the change in capacitance with respect to control voltage is negative. Thus, the polarities of the changes in capacitance in the variable capacitive elements on the input and output sides of the amplifier circuit are made to match equivalently.

Figure 9:
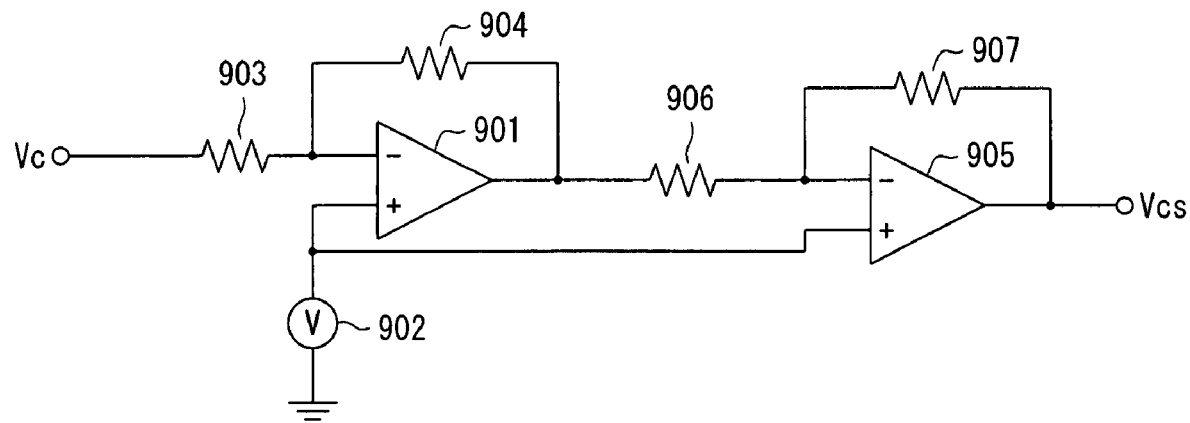
FIG. 9 shows an example construction of an analog operation circuit used in a sixth embodiment of the present invention.

Alternatively, with the variable capacitive elements connected in the same way on the input and output sides of the amplifier circuit, the analog operation circuit of FIG. 7 is replaced with a circuit shown in FIG. 9. This enables the same polarities to be achieved in the control voltages for the variable capacitive elements on the input and output sides. As a result, the polarity of the change in capacitance with respect to control voltage on the input side matches the polarity of the change in capacitance with respect to control voltage on the output side.

The analog operation circuit of FIG. 9 is constructed from a first inverting amplifier circuit that includes a differential operational amplifier circuit 901, a DC power source 902, a resistor 903, a resistor 904 and a second inverting amplifier circuit that includes a differential amplifier circuit 905, a DC power source 902, a resistor 906, and a resistor 907. The first and second inverting amplifier circuits are connected together to form a single non-inverting amplifier circuit.

A gain of the whole circuit can be changed by varying values of the resistors 903, 904, 906, and 907, and it is possible to adjust an offset voltage difference between an input voltage and an output voltage by means of a voltage value of the DC power source 902.

In the analog operation circuit with this construction, if the resistor 903 is denoted R1, the resistor 904 denoted R2, the resistor 906 denoted R3, and the resistor 907 denoted R4, the gain is (R2/R1)×(R4/R3), and the polarities of the input voltage and the output voltage are the same.

Figure 10:
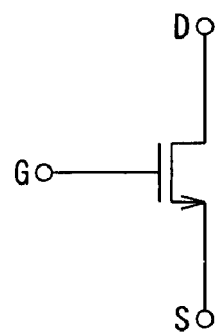
FIG. 10 shows an example of a different construction for the variable capacitive element.

Note that in the above-described embodiments, besides the MOS transistors shown in FIG. 3 and FIG. 8, the MOS transistor shown in FIG. 10 or a variable capacitive element diode may be used as the variable capacitive element. Any number, where the number is an integer not less than one, of variable capacitive elements may be connected to the input side, the output side, or both sides of the amplifier circuit. Moreover, one or more fixed capacitors may be used together with the one or more variable capacitive elements on the input side, the output side, or on both sides.

Examples of the Embodiments in Operation

Examples of embodiments in operation of the present invention are described below.

The following describes operations of the fifth embodiment as an example of an embodiment in operation. Since the fifth embodiment is based on the construction of the first embodiment, the description refers to FIG. 1 and FIG. 6.

Figure 11A:
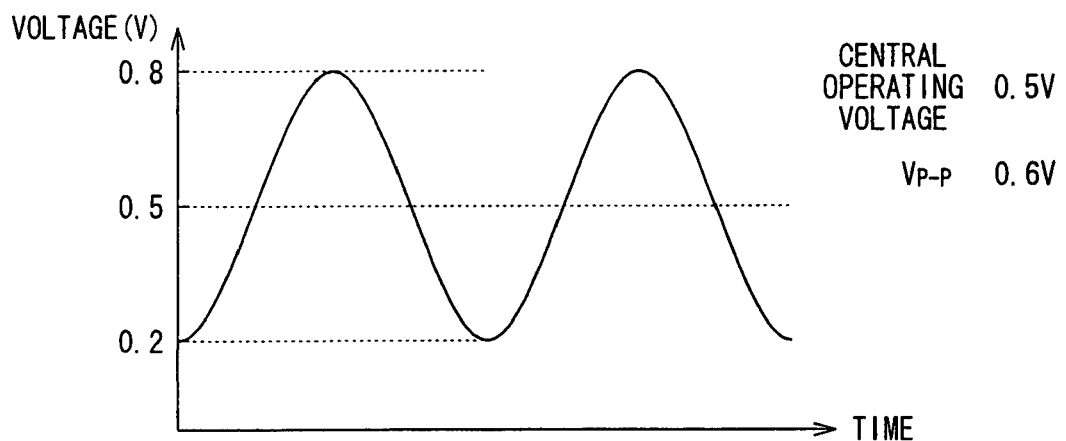
FIGS. 11A and 11B show example oscillation wave forms at an input-side terminal and an output-side terminal in an amplifier circuit of the embodiments.
Figure 11B:
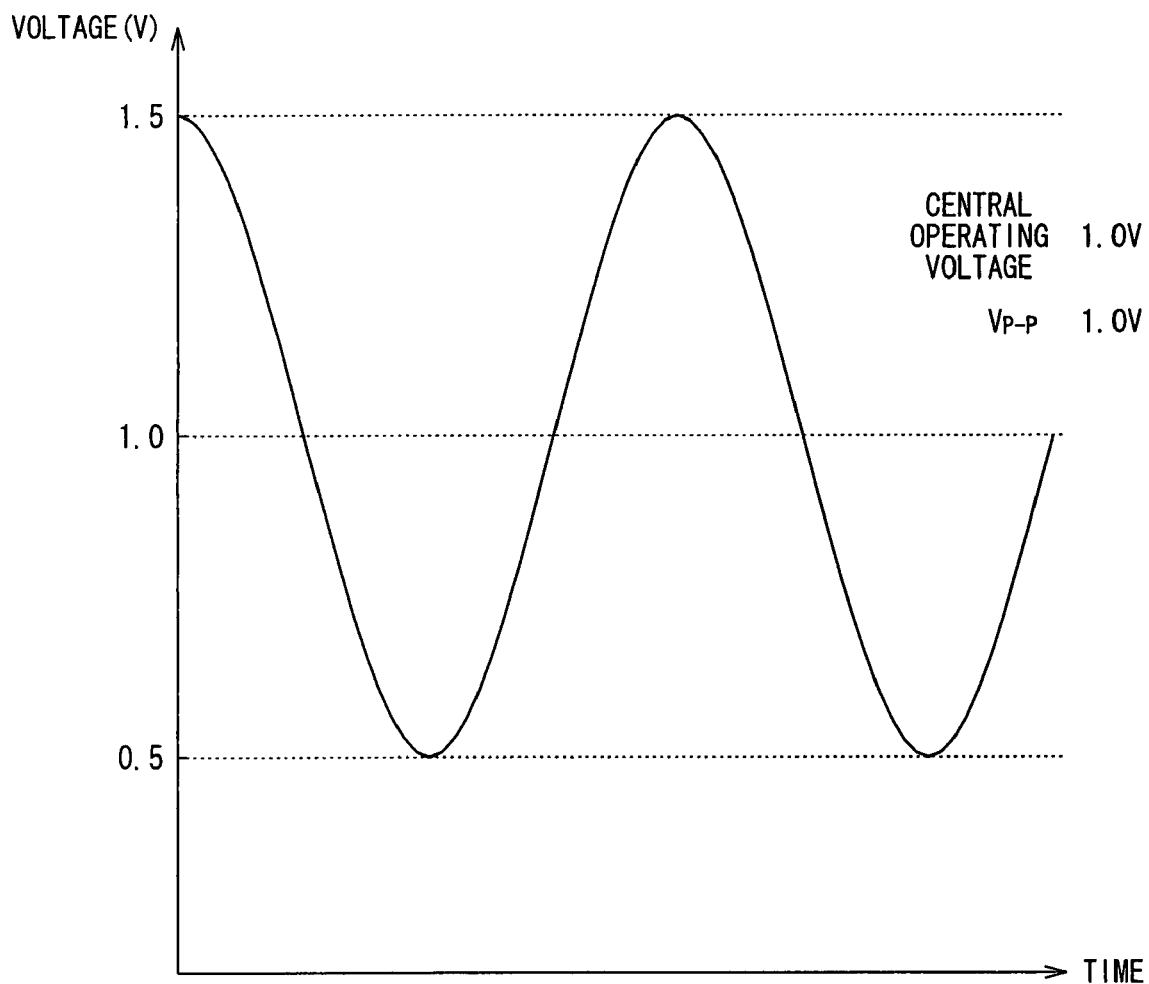

In this embodiment, the oscillation wave forms at the input terminal and the output terminal of the amplifier circuit 21 have differing amplitude and differing central operating voltages. To clarify the operations, an example of wave forms at the input terminal X and the output terminal Y during oscillation in FIG. 1 are shown in FIGS. 11A and 11B as an example.

Figure 12:
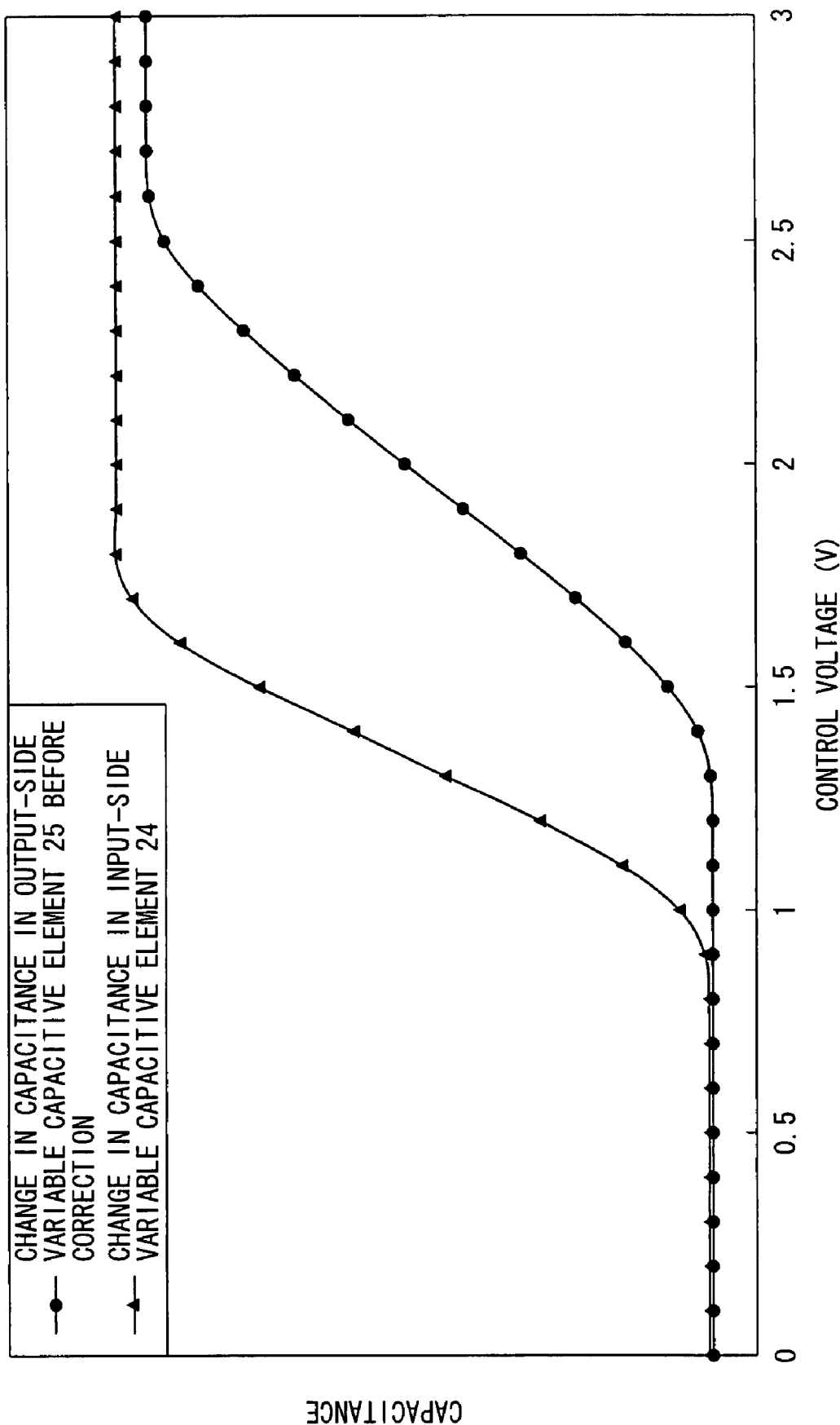
FIG. 12 illustrates how a change in capacitance of respective variable capacitive elements on the input and output sides depend on control voltage when a same control voltage is applied to both the input and output sides.

Further, FIG. 12 shows the respective changes in capacitance in the variable capacitive element 24 and the variable capacitive element 25 with respect to control voltage when a same control voltage is applied to the output-side variable capacitive element 25 and the input-side variable capacitive element 24 in FIG. 1. In other words, the control voltage Vc is not passed through the analog operation circuit 26. Note that the variable capacitive elements 24 and 25 make use of the circuit construction shown in FIG. 3.

According to FIG. 12, the capacitance of the input-side variable capacitive element 24 increases continuously between a control voltage Vc in the region of 0.9 V and control voltage Vc in the region of 1.7 V. On other hand, the capacitance of the output-side variable capacitive element 25 increases continuously between a control voltage Vc in the region of 1.4 V and control voltage Vc in the region of 2.5 V.

Figure 13:
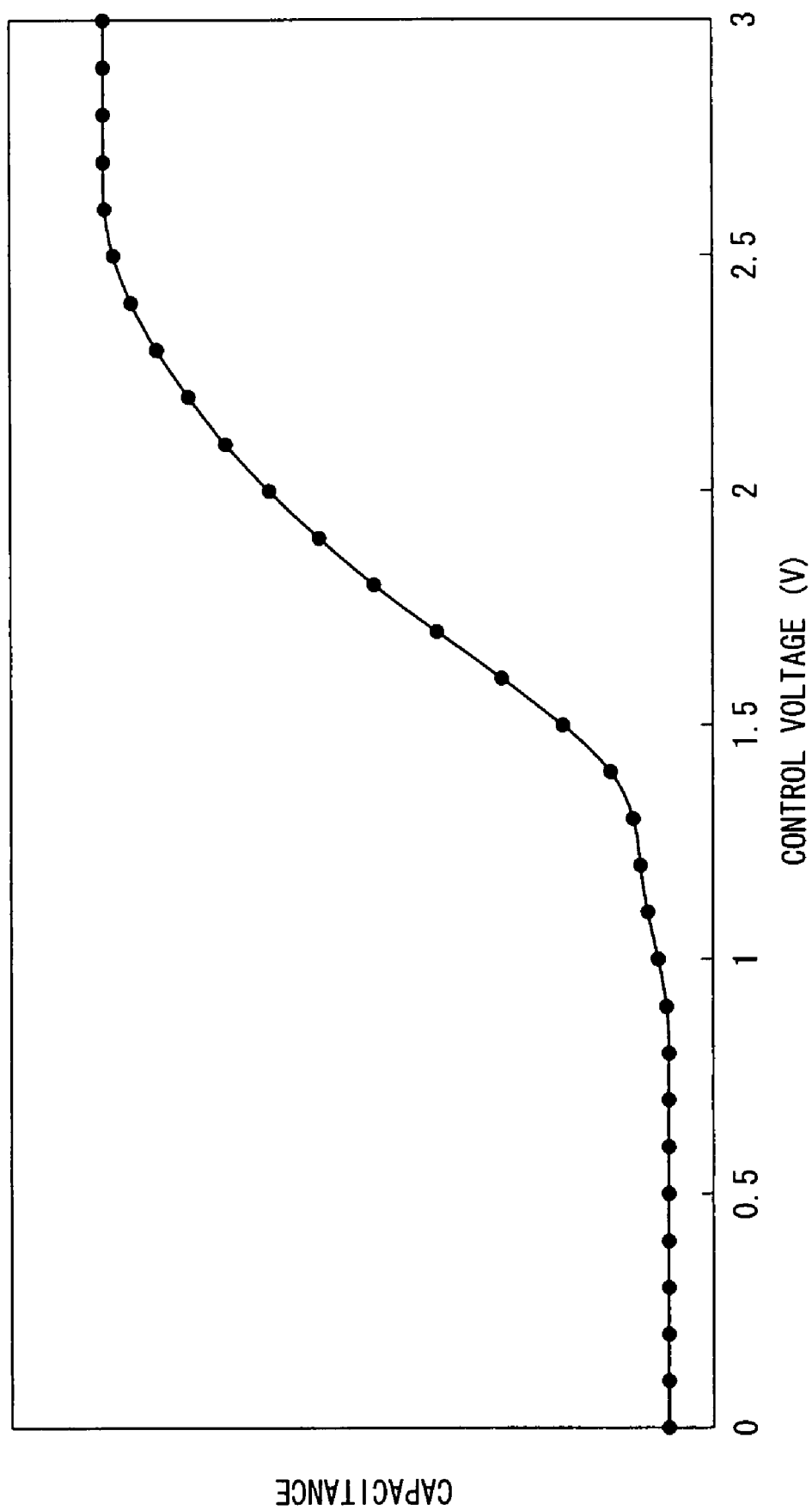
FIG. 13 illustrates how a change in load capacitance depends on control voltage when a same control voltage is applied to both the input and output sides.

Hence, the change with respect to the control voltage Vc in the combined capacitance of the input and output-side variable capacitive elements 24 and 25 is as shown in FIG. 13, and the linearity of the change in load capacitance with respect to control voltage Vc is poor.

Here, the gain and offset voltage of the analog operation circuit 26 in FIG. 1 are adjusted so that the analog operation circuit 26 generates a control voltage Vcs that causes the control voltage section corresponding to the change in capacitance in the output-side variable capacitive element 25 to match the control voltage section corresponding the change in capacitance in the input-side variable capacitive element 24. This control voltage Vcs is then applied to the output-side variable capacitive element 25.

In other words, the analog operation circuit 26 generates the control voltage Vcs in accordance with the control voltage Vc in order to match on the input and output side the changes in capacitance of the variable capacitive elements 24 and 25 with respect to control voltage to apply to the variable capacitive element 25.

Thus, the analog operation circuit 26 generates the desired control voltage Vcs so that the beginning point of the change in capacitance value of the variable capacitive element 24 with respect to inputted control voltage matches the beginning point of the change in capacitance value of the variable capacitive element 25 with respect to inputted control voltage, and the ending point of the change in capacitance value of the variable capacitive element 24 with respect to inputted control voltage matches the ending point of the change in capacitance value of the variable capacitive element 25 with respect to inputted control voltage.

The following is a practical description of a method to determine the control voltage Vcs, and refers to FIG. 1, FIG. 3, FIG. 11A, FIG. 11B and FIG. 12.

When the variable capacitive element 24 shown in FIG. 1 is of the circuit construction shown in FIG. 3, the control voltage Vc is applied to the gate terminal of the MOS transistor M1, and the drain terminal has a central operating voltage of 0.5 V and a wave-form peak-to-peak voltage difference Vpp (hereinafter Vpp) of 0.6 V (see FIG. 11A). At this point, since a minimum voltage at the drain terminal is 0.2 V and a maximum voltage is 0.8 V, when the threshold voltage for the variable capacitive element 24 (MOS transistor) is denoted Vt (V), the change in the capacitance of the variable capacitive element 24 begins at a control voltage Vc of 0.2+Vt (V) and ends at a control voltage Vc of 0.8+Vt (V). The central voltage for the change in capacitance is an oscillation amplitude central operating voltage of 0.5 V+Vt (V).

When the variable capacitive element 25 shown in FIG. 1 is of the circuit construction shown in FIG. 3, the control voltage Vcs generated by the analog operation circuit 26 is applied to the gate terminal of the MOS transistor M1, and the drain terminal has a central operating voltage of 1.0 V and a Vpp of 1.0 V (see FIG. 11B). At this point, since at the drain terminal a minimum voltage is 0.5 V and a maximum voltage is 1.5 V, when the threshold voltage for the variable capacitive element 25 (MOS transistor) is denoted Vt (V), the change in the capacitance of the variable capacitive element 25 begins at a control voltage Vcs of 0.5+Vt (V) and ends at a control voltage Vcs of 1.5+Vt (V). The central voltage for the change in capacitance is an oscillation amplitude central operating voltage of 1.0+Vt (V).

Now, with a threshold voltage Vt of 0.7 V for the variable capacitive elements 24 and 25, the change in the capacitance of the variable capacitive element 24 begins at a control voltage Vc of 0.9 V and ends at a control voltage Vc of 1.5 V. The central voltage for the change in capacitance is 1.2 V. The change in the capacitance of the variable capacitive element 25 is considered to begin at a control voltage Vcs of 1.2 V and end at a control voltage Vcs of 2.2 V. The central voltage for the change in capacitance is 1.7 V. In regions near the voltages at which the change in capacitance begins and ends, the change in capacitance of the variable capacitive element varies minutely, and so the beginning and end voltages may differ slightly from the stated values. The change in capacitance will however substantially match that shown in FIG. 12.

In summary, in the variable capacitive element 24 the changes in capacitance occur at control voltages Vc in the range 1.2±0.3 V, and in the variable capacitive element 25 the changes in capacitance occur at control voltages Vcs that are generated by the analog operation circuit 26 in the range 1.7±0.5 V.

In short, the changes in capacitance in the variable capacitive elements 24 and 25 are determined by the wave forms at oscillation terminals (the input and output terminals of the amplifier circuit 21) to which the variable capacitive elements are connected. A section D of the control voltage over which the change in capacitance occurs in the variable capacitive elements 24 and 25 is found as follows using equation (2).

$$D=\text{(central operating voltage of oscillation wave form+threshold voltage of variable capacitive element)}\pm\text{oscillation wave form } Vpp/2 \quad (2).$$

As described above, the range of control voltages Vc over which the change in capacitance of the variable capacitive element 24 occurs is 1.2±0.3 V, and the range of control voltages Vcs over which the change in capacitance of the variable capacitive element 25 occurs is 1.7±0.5 V. Thus, when Vc=Vcs, the changes in capacitance fail to match, as shown in FIG. 12.

The gain and offset (offset potential difference) of the analog operation circuit 26 are therefore adjusted so that, in the section where the control voltage Vc is 1.2±0.3 V, the control voltage Vcs becomes 1.7±0.5 V.

If the gain of the analog operation circuit 26 is denoted Ga, the offset (offset potential difference) is donated Oa, and a reference voltage for the control voltage Vc is denoted Vcc, the control voltage (output voltage) Vcs from the analog operation circuit 26 may be expressed as follows in equation (3) in the case of the control voltage Vc is inputted.

$$Vcs=(Vc-Vcc)\times Ga+(Vcc+Oa) \quad (3).$$

The gain Ga is set so that the control voltage Vcs varies ±0.5 V for the ±0.3 V section of the control voltage Vc, and can therefore be found as follows.

$$Ga=0.5/0.3=1.67.$$

When the reference voltage for the control voltage Vc is 1.2 V, the offset Oa is set so that the reference voltage for the control voltage Vcs is 1.7 V, and can therefore be found as follows.

$$Oa=1.7-1.2=0.5(V).$$

Substituting these into equation (3) gives the control voltage Vcs as follows.

$$Vcs = (Vc-1.2)\times 1.67 + (1.2+0.5)$$
$$= (Vc\times 1.67)-0.304.$$

Cases in which the gain Ga and the offset Oa of the analog operation circuit 26 are varied individually are described below.

If the gain Ga is made larger than 1.67, the change in the control voltage Vcs is larger than ±0.5 V for the ±0.3 V range of the control voltage Vc, and the change in capacitance of the variable capacitive element 25 becomes steeper.

If the offset Oa is made larger than 0.5 V, when the control voltage Vc is 1.2 V the control voltage Vcs becomes larger than 1.7 V, and so the beginning and end voltages for the change in capacitance in the variable capacitive element 25 with respect to the control voltage Vc become equivalently smaller.

In other words, to match the changes in capacitance with respect to the control voltage Vc in the variable capacitive elements 24 and 25, it is necessary to adjust the gain Ga and the offset Oa of the analog operation circuit 26.

More specifically, since the section over which the change in capacitance occurs in the variable capacitive elements 24 and 25 is expressed by equation (2), the gain Ga of the analog operation circuit 26 is found using a ratio of the Vpp at the oscillation terminals respectively connecting to the variable capacitive elements 24 and 25. In other words, the gain Ga is found as follows.

$Ga = (Vpp$ from oscillation amplitude at terminal connected to variable capacitive element $25)/(Vpp$ from oscillation amplitude at terminal connected to variable capacitive element $24) = 1.0/0.6 = 1.67$.

Similarly, the offset Oa of the analog operation circuit 26 is found using a difference between the central operating voltages at the oscillation terminals connecting to the variable capacitive elements 24 and 25. In other words, the offset Oa is found as follows.

$Oa = $(central operating voltage at terminal connected to variable capacitive element 25)−(central operating voltage of oscillation amplitude at terminal connected to variable capacitive element $24) = 1.0 - 0.5 = 0.5$(V).

Use of these properties enables the gain and the offset potential difference of the analog operation circuit 26 to be adjusted by observing the oscillation wave form using monitor as described below.

FIG. 14 shows an example of the relationship between the control voltage Vcs generated by the analog operation circuit 26 and the control voltage Vc inputted to the analog operation circuit 26.

When the circuit of FIG. 6 is used as the analog operation circuit 26, the resistor 603 is denoted R1, and the resistor 604 is denoted R2, the gain Ga is expressed as follows in equation (4).

$$Ga = 1 + (R2/R1) \quad (4).$$

The relationship between R1 and R2 is therefore R1:R2=1:0.67.

The voltage V1 applied by the DC power source 602, which is the voltage V1 generated by the DC power source 602, is V1=0.454 (V) from equation (5).

$$V1 = 1.2 - (1.7 - 1.2) \times (R1/R2) = 0.454 \quad (5).$$

Figure 15:
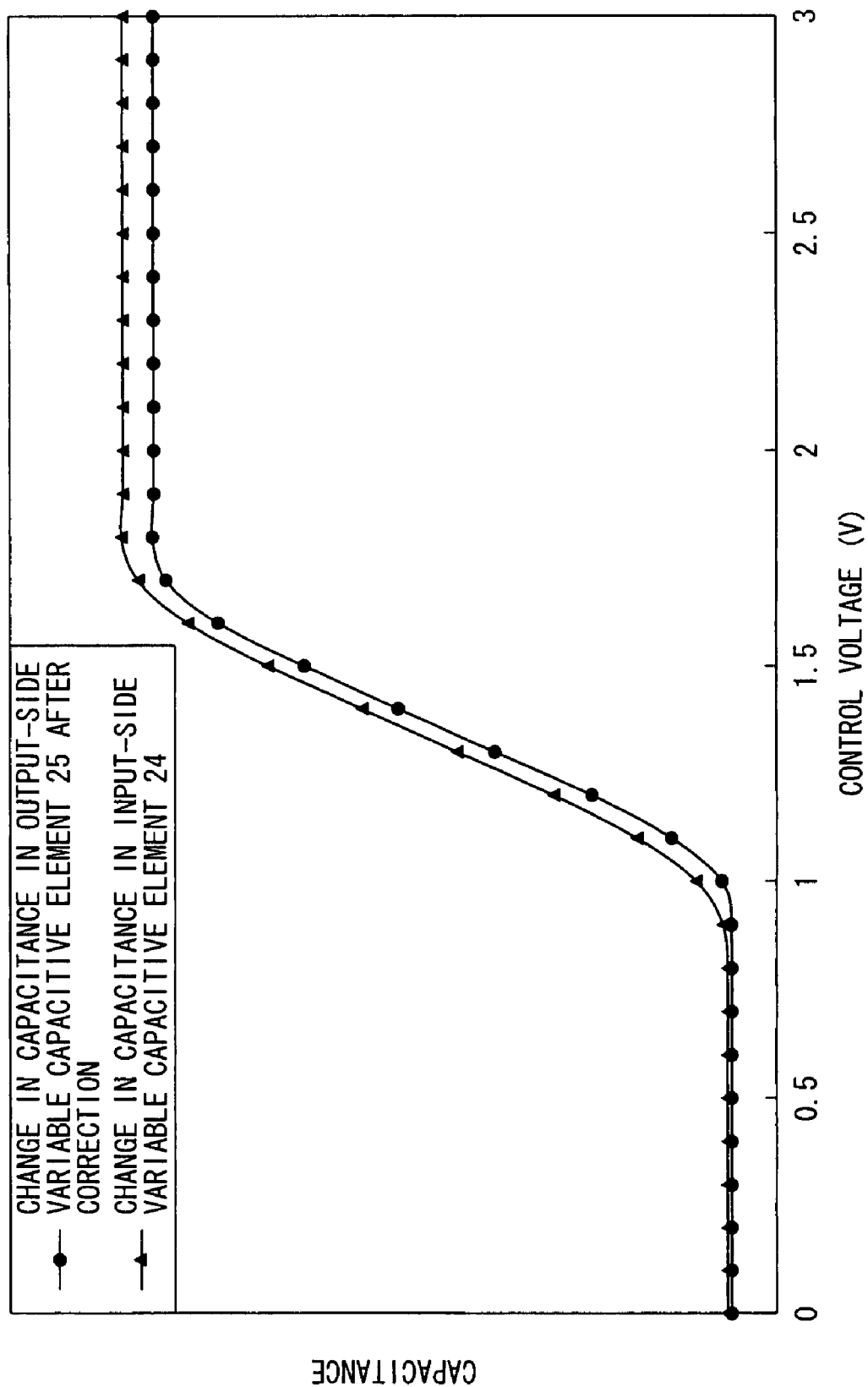
FIG. 15 illustrates how the changes in capacitance of the input and output-side variable capacitive elements depend on the control voltage in the present invention.

As a result of these operations by the analog operation circuit 26, the changes in capacitance with respect to the control voltage Vc in the variable capacitive elements 24 and 25 on the input and output side of the amplifier circuit 21 can be substantially matched, as shown in FIG. 15.

Figure 16:
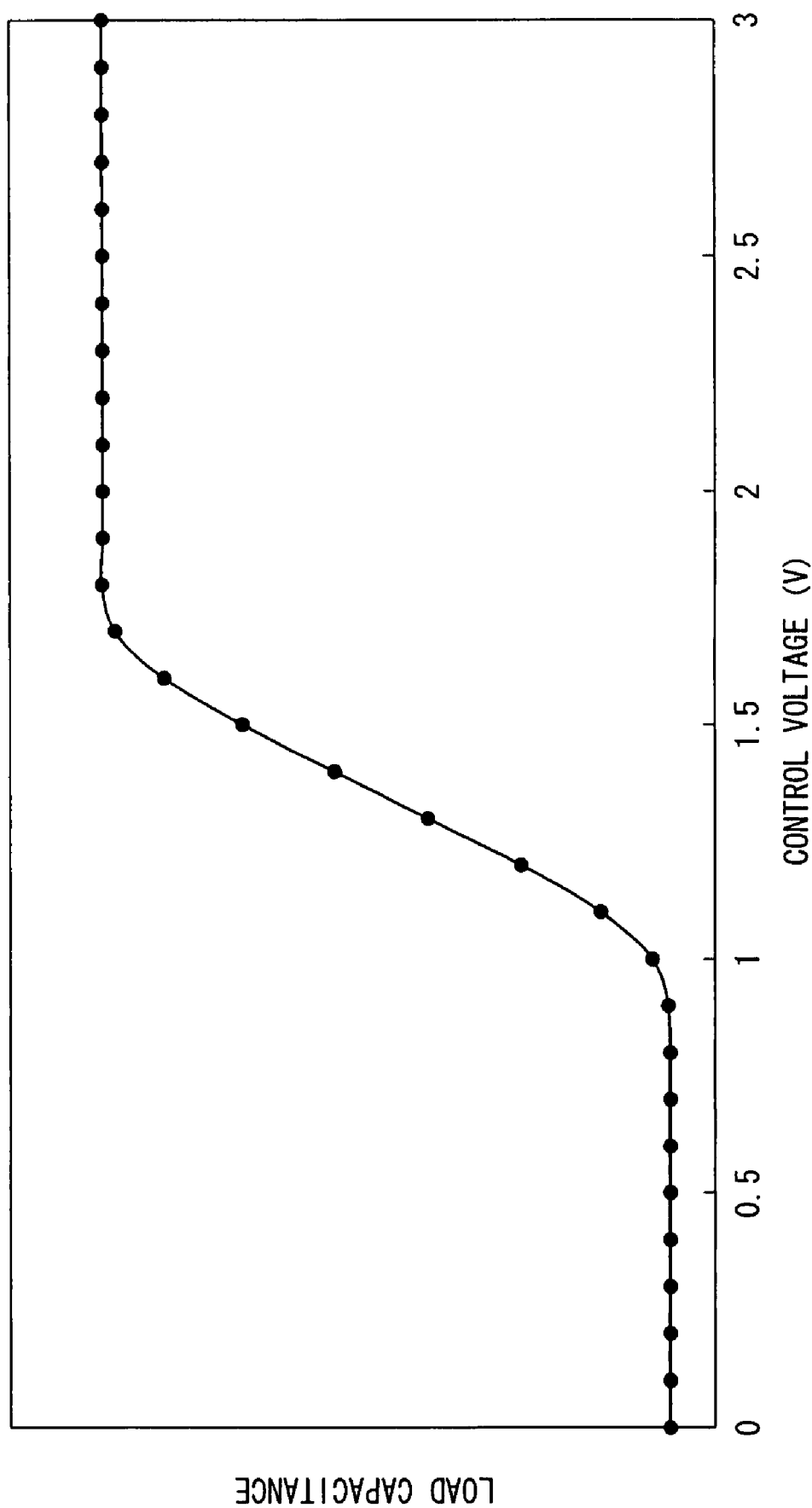
FIG. 16 illustrates how the change in a load capacitance depends on the control voltage in the present invention.
Figure 17:
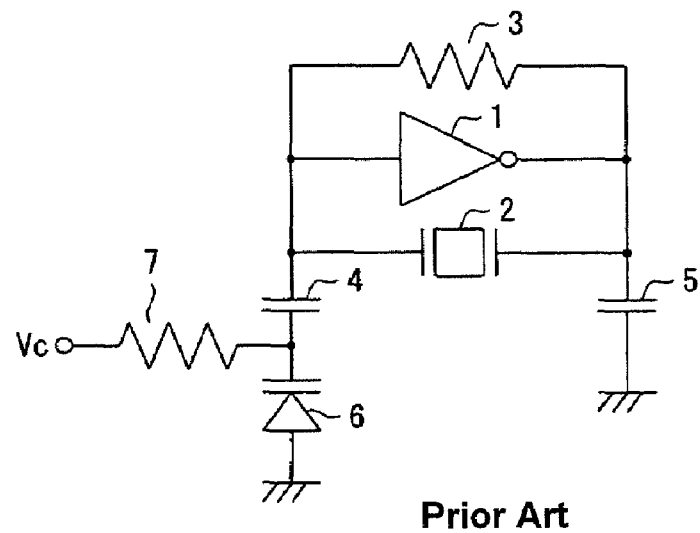
FIG. 17 shows an example construction of a conventional voltage controlled oscillator.
Figure 18:
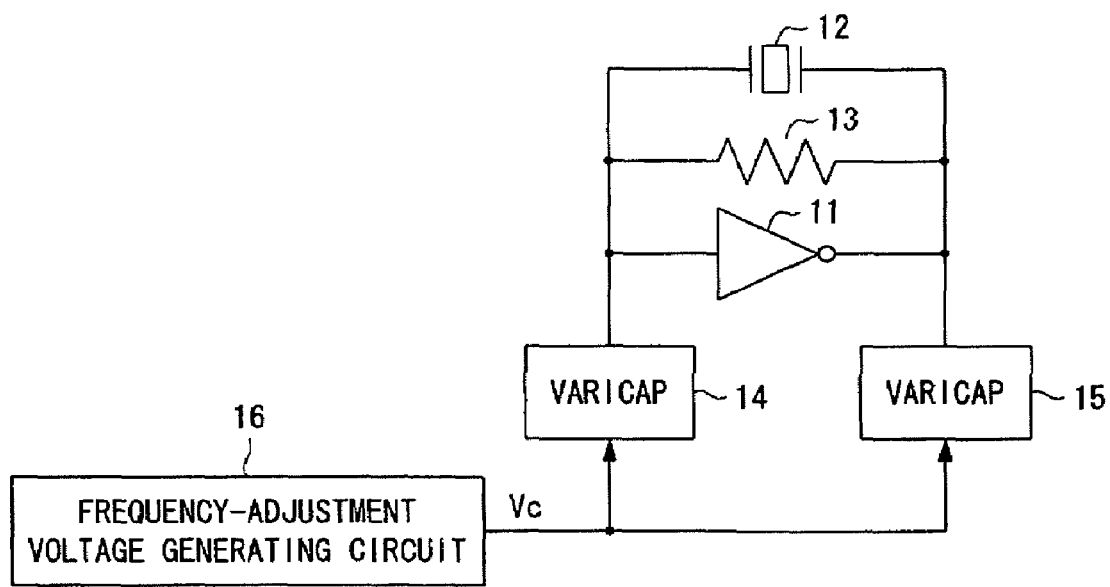
FIG. 18 shows an example a different construction of a conventional voltage controlled oscillator.
Figure 19:
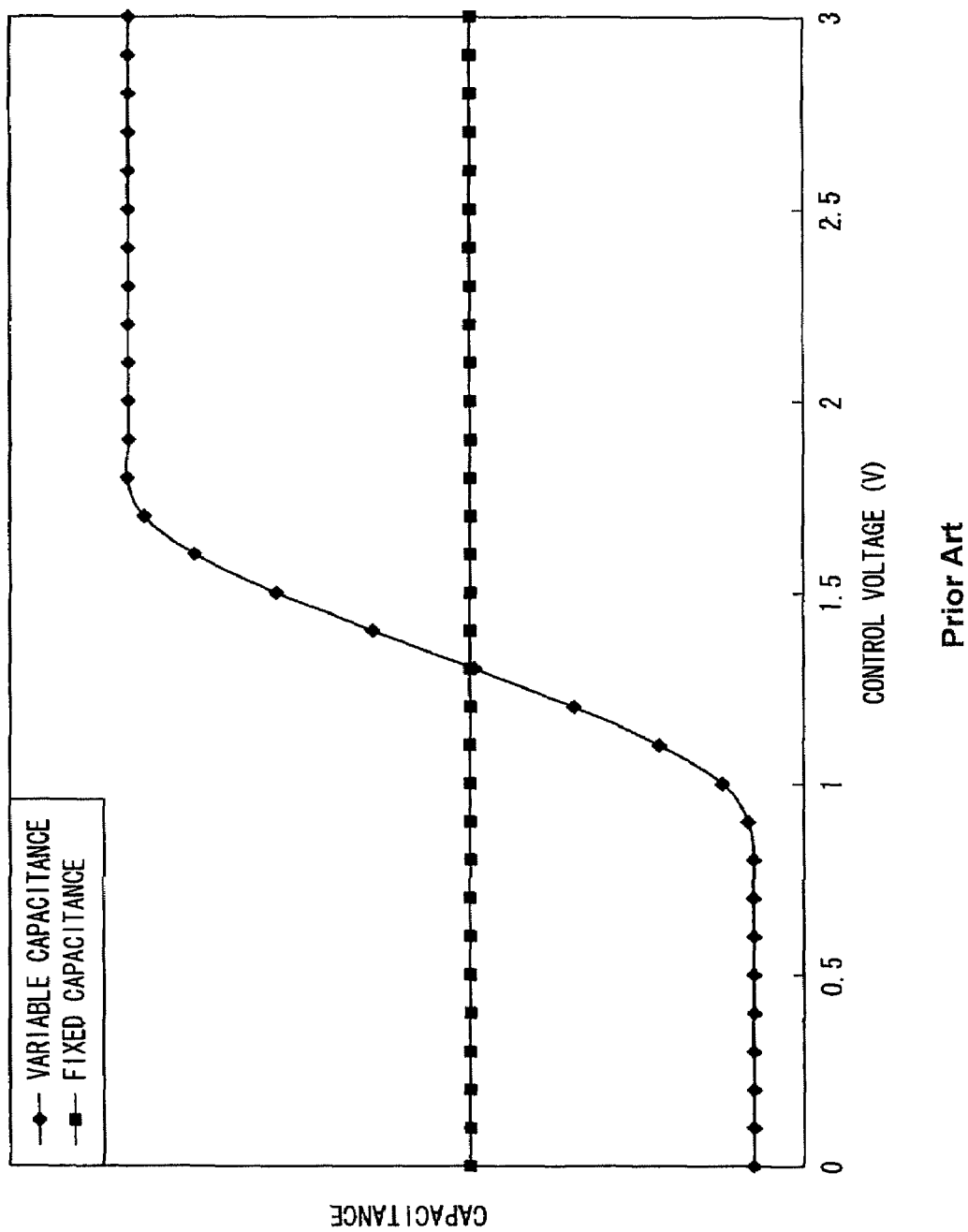
FIG. 19 illustrates how the changes in input-side capacitance and output-side capacitance in an amplifier circuit depend on the control voltage in a conventional voltage controlled oscillator.
Figure 20:
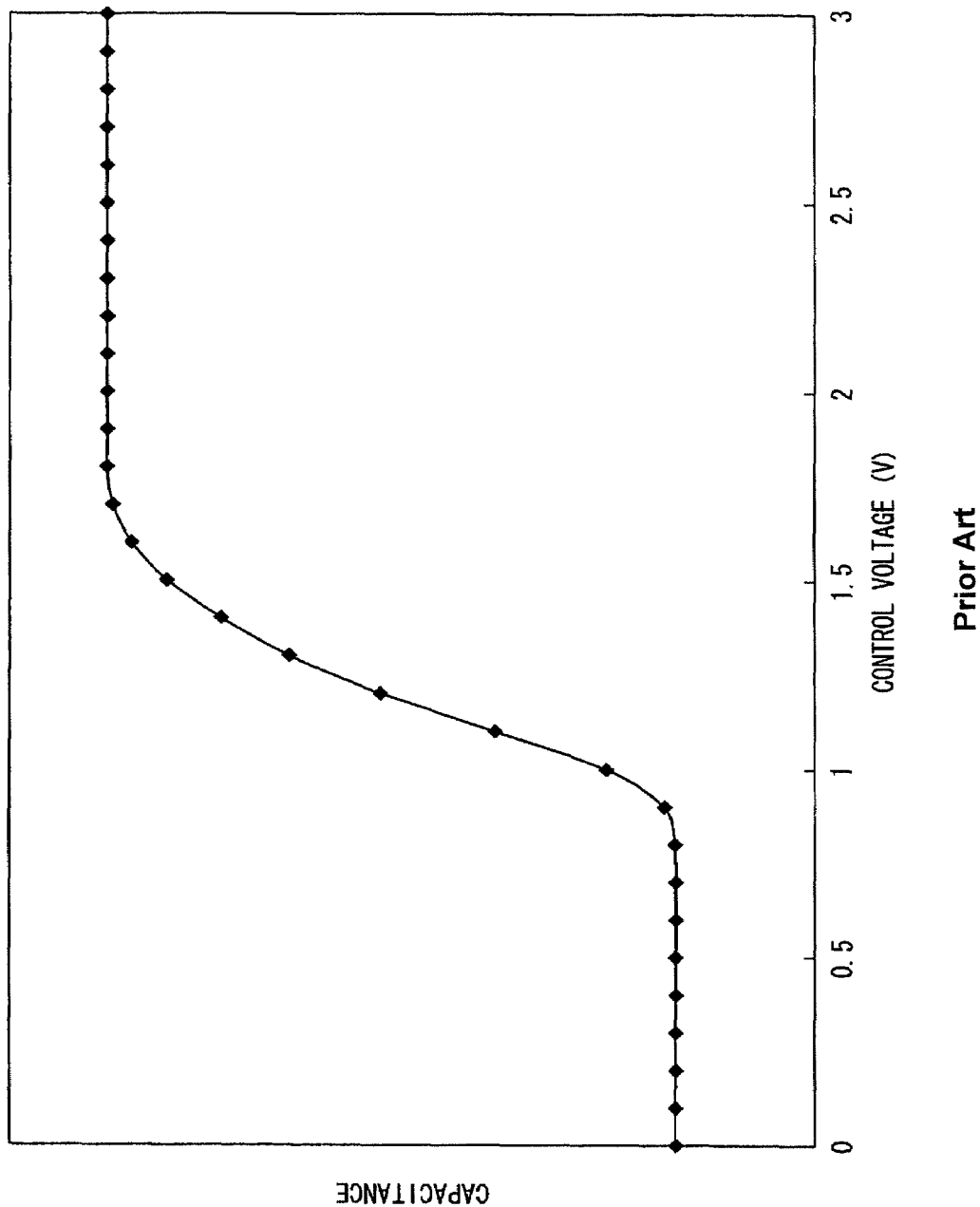
FIG. 20 illustrates how the change in load capacitance depends on the control voltage in a conventional voltage controlled oscillator.
Figure 21:
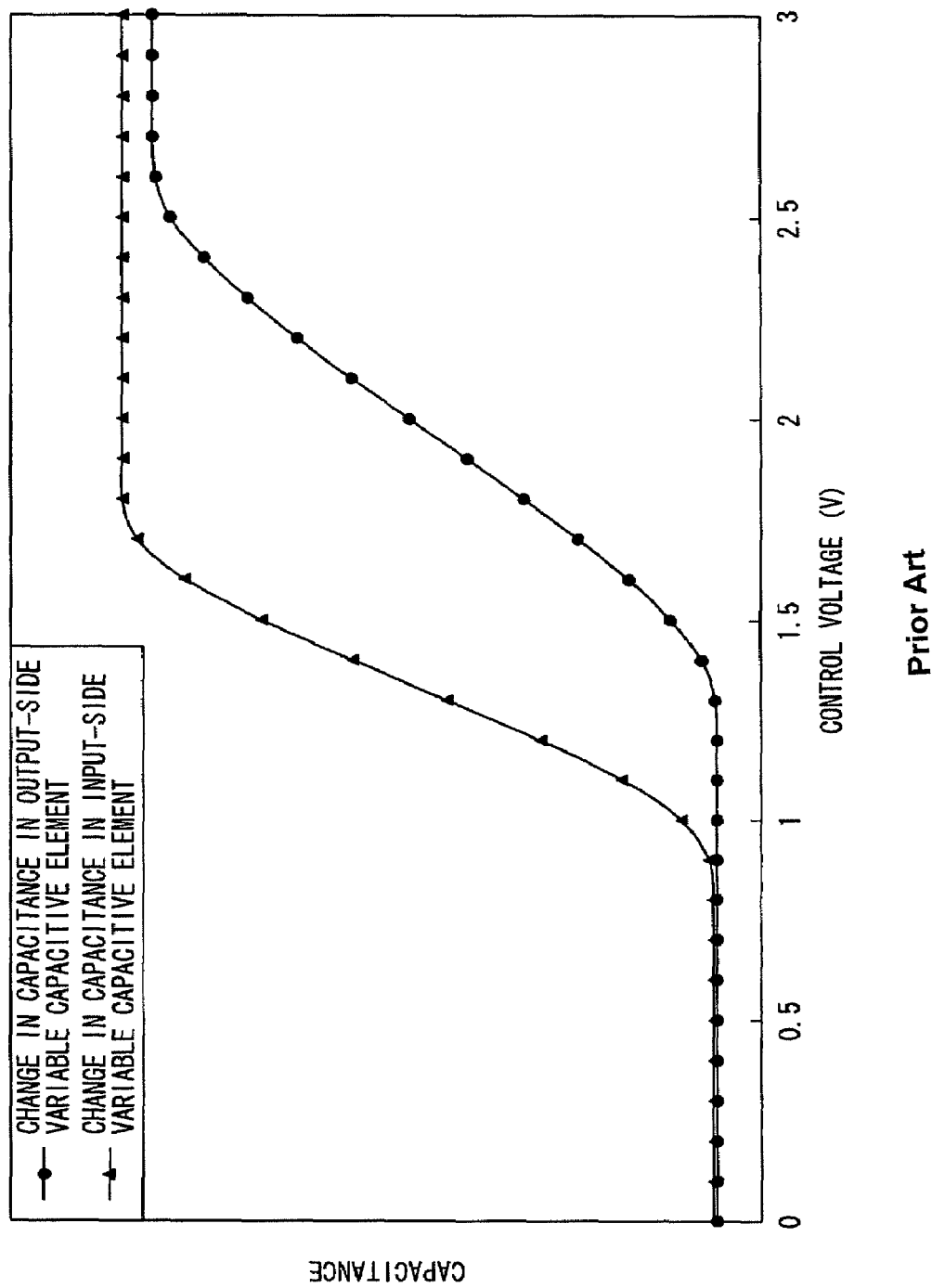
FIG. 21 illustrates how the changes in input-side capacitance and an output-side capacitance in an amplifier circuit depend on the control voltage in a conventional voltage controlled oscillator.
Figure 22:
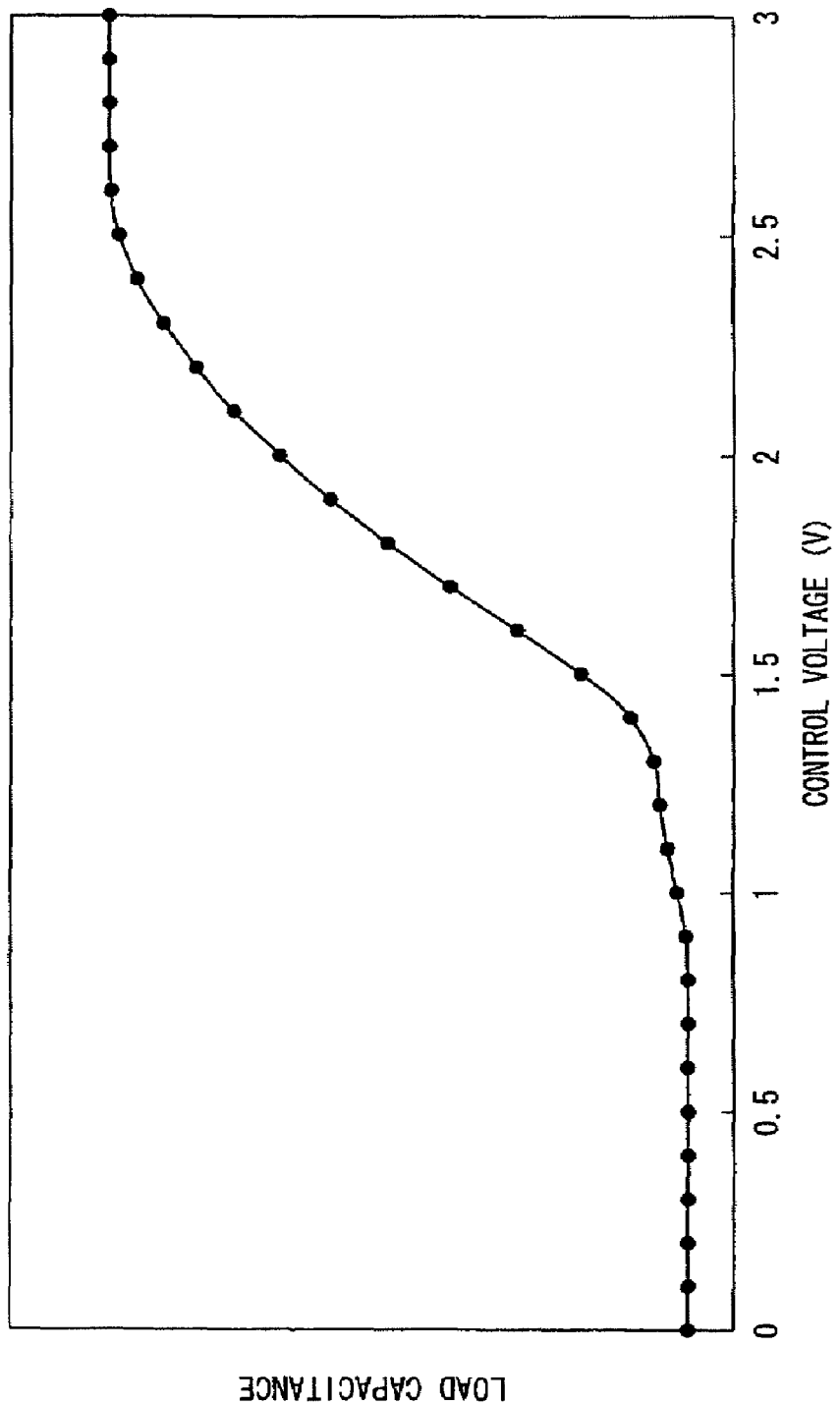
FIG. 22 illustrates how the change in the load capacitance depends on the control voltage in a conventional voltage controlled oscillator.

As shown in FIG. 16, since it is possible, by using the above embodiments, to make the change in the combined capacitance substantially linear with respect to the control voltage, the linearity of the change in oscillation frequency with respect to control voltage can be greatly improved.

When a smaller rate of change in oscillation frequency with respect to control voltage is desired, the following may be used.

For instance, adjusting the voltage of the DC power source 602 of the analog operation amplifier circuit 26 (see FIG. 6) reduces the value of the generated control voltage Vcs and causes the change in capacitance in the input-side variable capacitive element 24 to occur first and the change in capacitance in the output-side variable capacitive element 25 to occur second. Alternatively, the value of the control voltage Vcs may be increased so that the change in capacitance of the output-side variable capacitive element 25 occurs first and the change in capacitance of the input-side variable capacitive element 24 occurs second. In both cases, the rate of change of oscillation frequency with respect to control voltage can be lowered.

When doing this, it is possible to retain the linearity of the change in oscillation frequency with respect to control voltage by adjusting the gain of the analog operation circuit 26.

Though it is the operations of the fifth embodiment that are described above with reference to the FIG. 1 and FIG. 6, circuit operations in the other embodiments are substantially the same.

For instance, in the embodiment with the construction shown in FIG. 4, generating the control voltage Vcs by the analog operation circuit 26 so that the change in capacitance of the input-side variable capacitive element 24 corresponds to the change in capacitance of the output-side variable capacitive element 25 achieves effects resembling those in the circuit construction of FIG. 1. Moreover, as described above, it is possible to reduce the rate of change of frequency with respect to control voltage by adjusting the gain and the offset of the analog operation circuit 26.

Moreover, in the embodiment having the circuit construction shown in FIGS. 5A and 5B, it is possible to alter the section corresponding to the change in capacitance with respect to the control voltage Vc while retaining the linearity of the change by having the analog operation circuits 26 and 27 generate control voltages Vcs1 and Vcs2 that are smaller (or larger) than the control voltage Vc. This also makes it possible to adjust the rate of the change of frequency.

When the changes in capacitance in the input and output-side variable capacitive elements 24 and 25 are matched using the circuit construction of FIG. 1, the change in load capacitance is still as described above and shown in FIG. 16, but the range of the control voltages Vc over which the change in capacitance occurs is 1.2±0.3 V.

For instance, a control voltages Vc range of 1.5±1.5 V as the desired section corresponding to the change in capacitance is possible by using the circuit construction of FIG. 5 and adjusting the control voltages Vcs1 and Vcs2 inputted to the variable capacitive elements 24 and 25.

The change in capacitance in the variable capacitive element 24 occurs in the section where the control voltage Vcs1 is 1.2±0.3 V, and the change in capacitance in the variable capacitive element 25 occurs in the section where the control voltage Vcs2 is 1.7±0.5 V. Thus, by adjusting the gain and offset of the analog operation circuits 26 and 27 so as to output Vcs1=1.2±0.3 V and Vcs2=1.7±0.5 V for Vc=1.5±1.5 V, it is possible to vary the section over which the change in load capacitance occurs and thereby adjust the rate of change of capacitance (in other words the rate of change of frequency).

To satisfy the above condition using the circuit construction of FIG. 5A, a gain Ga1 and an offset Oa1 of the analog operation circuit 26 are set so that Ga1=0.3/1.5=0.2 and Oa1=1.2−1.5=−0.3 (V). Meanwhile, the gain Ga2 and the offset Oa2 of the analog operation circuit 27 are set so that Ga2=0.5/1.5=1/3 and Oa2=1.7−1.5=0.2 (V).

If, however, the circuit construction of FIG. 5B is used, the gain Ga1 and the offset Oa1 of the analog operation circuit 26 are set so that Ga1=0.3/1.5=0.2 and Oa1=1.2−1.5=−0.3 (V). The gain Ga2 and the offset Oa2 of the analog operation circuit 27 are set so that Ga2=0.5/0.3=5/3 and Oa2=1.7−1.2=0.5 (V).

More specifically, the gains Ga1 and Ga2 of the analog operation circuits 26 and 27 are found using the ratio of Vpp at the oscillation terminals to which the variable capacitive elements 24 and 25 are respectively connected.

In other words, Ga1/Ga2 can be found as follows.

Ga1/Ga2=(Vpp for oscillation amplitude at terminal connected to variable capacitive element 25)/ (Vpp for oscillation amplitude at terminal connected to variable capacitive element 24).

Hence if one of the gains Ga1 and Ga2 is set to a desired value, the other can be determined.

The offsets Oa of the analog operation circuits 26 and 27 are found in a similar manner using the differences in the central operating voltages at the oscillation terminals respectively connected to the variable capacitive elements 24 and 25.

The offset Oa can be found as follows.

Oa=(central operating voltage at terminal connected to variable capacitive element 25)−(central operating voltage of oscillation amplitude at terminal connected to variable capacitive element 24).

Use of these characteristics enables adjustment of the gain and offset of the analog operation circuits 26 and 27 by observing the oscillation wave form.

These methods are useful when the amplitude of oscillation wave form is exceedingly large, when the amplitude of oscillation wave form is exceeding small and when the circuit is being operated using a low-power source voltage.

Also, none of the embodiments demand that all parts are included in one or more IC. Operations equivalent to the operations of the embodiments can be achieved using present methods. In other words, the circuits may be constructed from individual parts.

In any one or more of the embodiments, adjustments to the gain and offset voltage of the analog operation circuit can be from within the IC, or from an external part using an external digital signal.

Internal adjustment of the IC enables the variation in performance that is introduced during IC manufacture to be suppressed.

External adjustment to the IC enables an equivalent suppression of the manufacturing variation in parts other than the IC. For example, in circuit construction where the piezoelectric element and the IC are combined, even if the IC variation (manufacturing variation in components other than the piezoelectric element) is suppressed, the characteristics of the combined circuit will vary due to the variation resulting from the piezoelectric element manufacturing process. However, if external adjustment of the IC is used to eliminate the piezoelectric element variation, it is possible to reduce variation in the characteristics of the combined circuit.

Possible methods for adjusting the gain and offset of the analog operation circuit include altering the values of the resistors 603 and 604 and the DC power source 602 in the circuit of FIG. 6 by switching one or more switches that control the values of the resistors 603 and 604 and the DC power source 602. The switching is controlled using an external signal and volatile memory, non-volatile memory or the like.

Seventh Embodiment

A construction of a seventh embodiment of the voltage controlled oscillator of the present invention is described below.

The voltage controlled oscillator of the seventh embodiment is the arrangement of any of the first to fifth embodiments, in which the wave form at the input and output terminals of the amplifier circuit 21 is monitored, the gain and the offset of the analog operation circuit 26 or the analog operation circuit 27 can be adjusted or controlled, and the adjustment and control is performed using memory or the like. Other portions of the seventh embodiment have a construction that is substantially the same as in the first to fifth embodiments, and so a description of these other portions is omitted.

Figure 23:
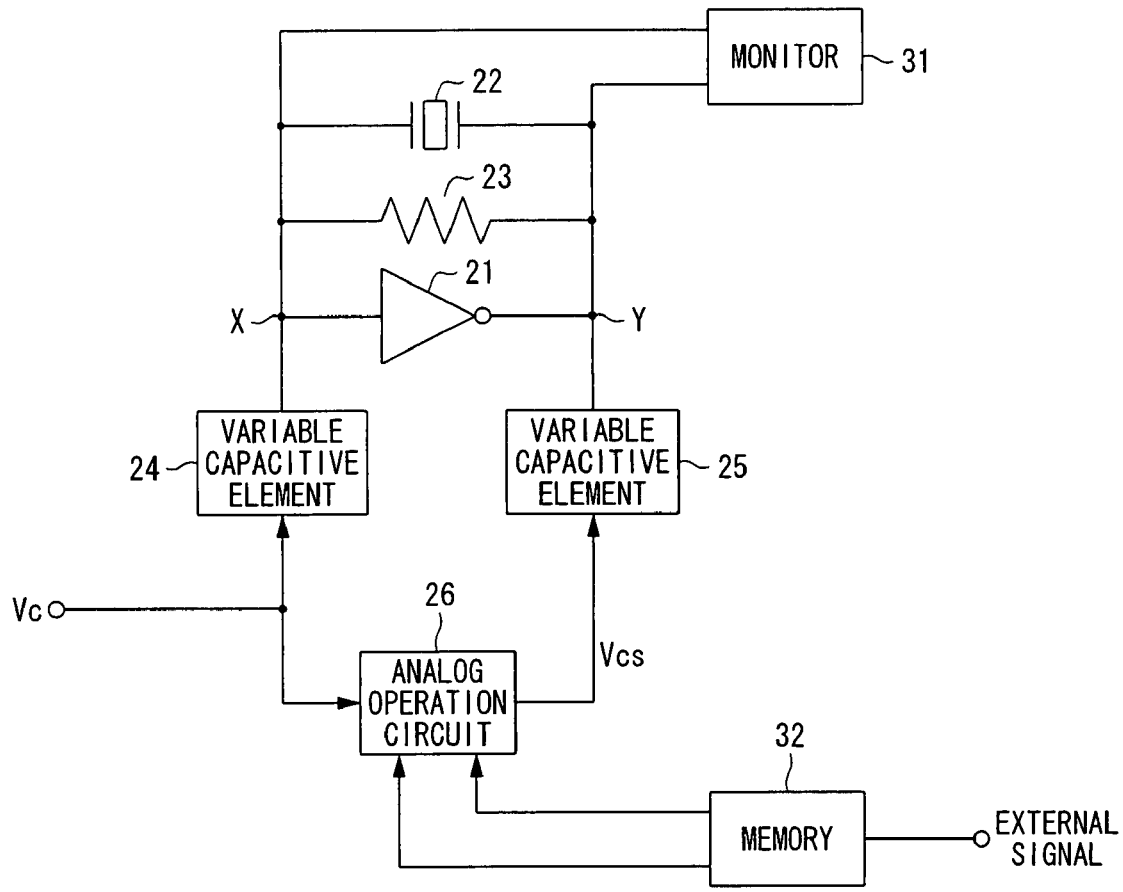
FIG. 23 shows a construction of a seventh embodiment of the present invention.
Figure 24:
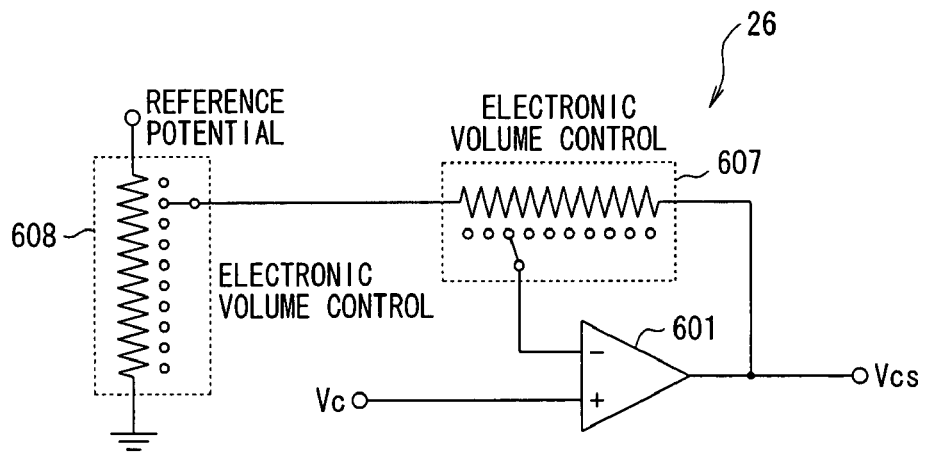
FIG. 24 shows an example construction of an analog operation circuit.

FIG. 23 shows an implementation of the seventh embodiment. FIG. 24 shows an example construction of the analog operation circuit in FIG. 23.

The seventh embodiment is based on the construction of the first embodiment shown in FIG. 1, but further includes a monitor (voltage measuring device) 31 that measures respective wave forms at an input terminal X and an output terminal Y of the amplifier circuit 21 and a memory 32 that sets the gain and the offset for the analog operation circuit 26 based on the voltages measured by the monitor 31. The memory 32 is, for instance, made up of non-volatile memory that allows free data reading and writing.

The seventh embodiment may include two measured terminals (not shown in the drawings) at which the respective voltage wave forms at the input terminal X and the output terminal Y of the amplifier circuit 21 are measured. Both measured terminals may connect to measurement probes or the like in the monitor 31 so as to enable measurement of the respective voltage wave forms (voltage values).

The analog operation circuit 26 includes, as shown in FIG. 24, the differential operational amplifier circuit 601, an electronic volume control 607, constructed from a transistor or the like, and an electronic volume control 608 constructed from a transistor or the like.

The electronic volume control 607 alters the ratio of the input resistor and the feedback resistor of the differential operational amplifier circuit 601 and thereby sets the gain of the analog operation circuit 26 to a desired value. In order to achieve this, a first side of the electronic volume control 607 is connected to an output terminal of the electronic volume control 608, and an other side is connected to the output terminal of the differential operational amplifier circuit 601. A middle tab of the electronic volume control 607 is connected via a switch to the − input terminal of the differential amplifier circuit 601. It is then possible to have the electronic volume control 607 set (adjust) the gain of analog operation circuit 26 to a desired value by switching the switch according to a control signal (control data) from the memory 32. After setting, the set value is maintained by the memory 32.

The electronic volume control 608 sets (controls) the offset potential difference of the analog operation circuit 26 to a desired value. In order to achieve this, a first end of the electronic volume control 608 is supplied with the reference voltage, an other end is connected to ground, and a middle tab is connected via a switch to the first end side of the electronic volume control 607. It is then possible to alter the resistance value of the electronic volume control 608 by switching the switch according to a control signal from the memory 32, and thereby set (adjust) the offset potential difference of the analog operation circuit 26 to a desired value. After setting, the set value is maintained by the memory 32.

When the seventh embodiment is constructed using an IC, the wave form measured using the monitor 31 may be temporarily outputted to an external part and then fed back to the memory 32, or may be processed within the IC without being outputted to the external part. If the arrangement allows the values in the memory 32 to be set from the external part of IC, it is possible to freely adjust the gain and offset potential difference of the analog operation circuit 26.

The following describes, with reference to FIG. 23 and FIG. 24, an example of a design (production) procedure for a voltage controlled oscillator with desired characteristics according to the seventh embodiment having the above construction.

First, the voltage controlled oscillator shown in FIG. 23 is put into an oscillating state, and the voltage wave forms (voltage values) at the input terminal X and the output terminal Y of the amplifier circuit 21 are measured using the monitor 31.

Next, the desired control voltage Vcs to be generated by the analog operation circuit 26 is determined based on the measured voltage values. The desired control voltage Vcs is selected so that the change in capacitance value in the variable capacitive element 24 with respect to the inputted control voltage value Vc matches the change in capacitance value in the variable capacitive element 25 with respect to the inputted control voltage value Vc.

The values of the gain and the offset of the analog operation circuit 26 are set while measuring (monitoring) both of the voltage wave forms using the monitor 31, so that the analog operation circuit 26 generates the desired control voltage Vcs. Setting to these values is performed by switching the switches of the electronic volume controls 607 and 608 of the analog operation circuit 26 using control signals from the memory 32.

By designing the voltage controlled oscillator using this procedure, the change in the combined capacitance value, which includes the capacitance value of the variable capacitive element 24 and the capacitance value of the variable capacitive element 25, with respect to the inputted control voltage Vc can be made linear.

INDUSTRIAL APPLICABILITY

According to the above invention, different control voltages are applied to input and output-side variable capacitive elements according to differences in oscillation amplitudes and central operating voltages at the input-side terminal and the output-side terminal of an amplifier circuit, and it is thereby possible to match changes in capacitance with respect to control voltage in the variable capacitive elements on the input and output sides, and as a result, to make the change in load capacitance linear with respect to the control voltage.

Also, by increasing the offset potential difference between the voltages applied to the respective input and output-side variable capacitive elements, it is possible to adjust a rate of change of frequency with respect to the control voltage while retaining the linearity in the change in capacitance with respect to control voltage.

The invention claimed is:

1. A voltage controlled oscillator comprising:
   an amplifier circuit;
   a piezoelectric element that is connected between an input terminal and an output terminal of the amplifier circuit and forms a feedback loop;
   first and second variable capacitive elements with capacitance values that change according to a control voltage, respectively connected to the input terminal and the output terminal; and
   an analog operation circuit that generates a desired control voltage based on an inputted control voltage and applies the desired control voltage to at least one of the first and second variable capacitive elements;
   wherein the analog operation circuit has a multiplicative gain and generates an offset potential difference; and
   wherein the inputted control voltage is applied to one of the first and second variable capacitive elements, and the desired control voltage generated by the analog operation circuit is applied to the other of the first and second variable capacitive elements.

2. The voltage controlled oscillator of claim 1, wherein when the inputted control voltage varies in a range of ±V1 from a reference voltage Vc1 and the desired control voltage varies in a range of ±V2 from a reference voltage Vc2, the gain of the analog operation circuit is V2/V1 and the offset potential difference is (Vc2−Vc1).

3. The voltage controlled oscillator of claim 1, wherein when the oscillation amplitude at the input terminal is V3, the oscillation amplitude at the output terminal is V4, a central operating voltage at the input terminal is Vc3, and a central operating voltage at the output terminal is Vc4, in the analog operation circuit the gain is V4/V3 and the offset potential difference is (Vc4−Vc3).

4. The voltage controlled oscillator of claim 1, wherein when the oscillation amplitude at the input terminal is V3, the oscillation amplitude at the output terminal is V4, a central operating voltage at the input terminal is Vc3, and a central operating voltage at the output terminal is Vc4, in the analog operation circuit the gain is V3/V4 and the offset potential difference is (Vc3−Vc4).

5. A voltage controlled oscillator comprising:
   an amplifier circuit;
   a piezoelectric element that is connected between an input terminal and an output terminal of the amplifier circuit and forms a feedback loop;
   first and second variable capacitive elements with capacitance values that change according to a control voltage, respectively connected to the input terminal and the output terminal; and
   an analog operation circuit that generates a desired control voltage based on an inputted control voltage and applies the desired control voltage to at least one of the first and second variable capacitive elements;
   wherein the analog operation circuit has a multiplicative gain and generates an offset potential difference; and
   wherein the analog operation circuit includes a first analog operation circuit that generates a desired first control voltage based on the inputted control voltage and a second analog operation circuit that generates a desired second control voltage based on the first control voltage, and the first control voltage is applied to one of the first and second variable capacitive elements and the second control voltage is applied to the other of the first and second variable capacitive elements.

6. The voltage controlled oscillator of claim 5, wherein when the inputted control voltage varies in a range of ±V1 from a reference voltage Vc1, the first control voltage varies in a range of ±V7 from a reference voltage Vc7, and the second control voltage varies a range of ±V8 from a reference voltage Vc8, in the first analog operation circuit the gain is V7/V1 and the offset potential difference is (Vc7−Vc1) and in the second analog operation circuit the gain is V8/V7 and the offset potential difference is (Vc8−Vc7).

7. The voltage controlled oscillator of claim 5, wherein when the oscillation amplitude at the input terminal is V3, the oscillation amplitude at the output terminal is V4, a central operating voltage at the input terminal is Vc3, and a central operating voltage at the output terminal is Vc4, in the second analog operation circuit the gain is V4/V3 and the offset potential difference is (Vc4−Vc3).

8. The voltage controlled oscillator of claim 5, wherein when the oscillation amplitude at the input terminal is V3, the oscillation amplitude at the output terminal is V4, a central operating voltage at the input terminal is Vc3, and a central operating voltage at the output terminal is Vc4, in the second analog operation circuit the gain is V3/V4 and the offset potential difference is (Vc3−Vc4).

9. A voltage controlled oscillator comprising:
an amplifier circuit;
a piezoelectric element that is connected between an input terminal and an output terminal of the amplifier circuit and forms a feedback loop;
first and second variable capacitive elements with capacitance values that change according to a control voltage, respectively connected to the input terminal and the output terminal; and
an analog operation circuit that generates a desired control voltage based on an inputted control voltage and applies the desired control voltage to at least one of the first and second variable capacitive elements;
wherein the analog operation circuit has a multiplicative gain and generates an offset potential difference;
wherein the analog operation circuit includes a first analog operation circuit that generates a desired first control voltage based on the inputted control voltage and a second analog operation circuit that generates a desired second control voltage based on the inputted control voltage, and the first control voltage is applied to one of the first and second variable capacitive elements and the second control voltage is applied to the other of the first and second variable capacitive elements, and
wherein when the inputted control voltage varies in a range of ±V1 from a reference voltage Vc1, the first control voltage varies in a range of ±V5 from a reference voltage Vc5 and the second control voltage varies in a range of ±V6 from a reference voltage Vc6, in the first analog operation circuit the gain is V5/V1 and the offset potential difference is (Vc5−Vc1) and in the second analog operation circuit the gain is V6/V1 and the offset potential difference is (Vc6−Vc1); and
wherein the pain V5/V1 is different from the pain V6/V1.

10. The voltage controlled oscillator of any of claims 1, 5, and 9, wherein the analog operation circuit generates the desired control voltage so that a change in capacitance value of the first variable capacitive element with respect to the inputted control voltage matches a change in capacitance value of the second variable capacitive element with respect to the inputted control voltage.

11. The voltage controlled oscillator of any of claims 1, 5, and 9, wherein the analog operation circuit generates the desired control voltage so that a beginning point for the change in the capacitance value of the first variable capacitive element with respect to the inputted control voltage matches a beginning point for the change in the capacitance value of the second variable capacitive element with respect to the inputted control voltage, and an end point for the change in the capacitance value of the first variable capacitive element with respect to the inputted control voltage matches an end point for the change in the capacitance value of the second variable capacitive element with respect to the inputted control voltage.

12. The voltage controlled oscillator of any of claims 1, 5, and 9, wherein a change in a combined capacitance value that includes the capacitance value of the first variable capacitive element and the capacitance value of the second variable capacitive element is linear with respect to the inputted control voltage.

13. The voltage controlled oscillator of any of claims 1, 5, and 9, wherein when the analog operation circuit is an IC associated with other ICs, the gain and the offset potential difference of the analog operation circuit are set to different values in the other ICs.

14. The voltage controlled oscillator of any of claims 1, 5, and 9, wherein the amplifier circuit, the first and second variable capacitive elements and the analog operation circuit are formed on a same substrate and built into an IC.

15. The voltage controlled oscillator of any of claims 1, 5, and 9, wherein the piezoelectric element is a surface acoustic wave piezoelectric element.

16. A voltage controlled oscillator comprising:
an amplifier circuit;
a piezoelectric element that is connected between an input terminal and an output terminal of the amplifier circuit and forms a feedback loop;
first and second variable capacitive elements with capacitance values that change according to a control voltage, respectively connected to the input terminal and the output terminal; and
an analog operation circuit that generates a desired control voltage based on an inputted control voltage and applies the desired control voltage to at least one of the first and second variable capacitive elements;
wherein the analog operation circuit has a multiplicative gain and generates an offset potential difference;
wherein the analog operation circuit includes a first analog operation circuit that generates a desired first control voltage based on the inputted control voltage and a second analog operation circuit that generates a desired second control voltage based on the inputted control voltage, and the first control voltage is applied to one of the first and second variable capacitive elements and the second control voltage is applied to the other of the first and second variable capacitive elements; and
wherein when the oscillation amplitude at the input terminal is V3, the oscillation amplitude at the output terminal is V4, a central operating voltage at the input terminal is Vc3, and a central operating voltage at the output terminal is Vc4, a ratio of the gain in the first analog operation circuit and the gain in the second analog operation circuit is V4/V3 and a difference between the offset potential difference of the first analog operation circuit and the offset potential difference in the second analog operation circuit is (Vc4−Vc3).

17. A voltage controlled oscillator comprising:
an amplifier circuit;
a piezoelectric element that is connected between an input terminal and an output terminal of the amplifier circuit and forms a feedback loop;
first and second variable capacitive elements with capacitance values that change according to a control voltage, respectively connected to the input terminal and the output terminal; and
an analog operation circuit that generates a desired control voltage based on an inputted control voltage and applies the desired control voltage to at least one of the first and second variable capacitive elements;
wherein the analog operation circuit has a multiplicative gain and generates an offset potential difference; and
wherein the gain and the offset potential difference of the analog operation circuit are alterable.

18. A voltage controlled oscillator comprising:
an amplifier circuit;
a piezoelectric element that is connected between an input terminal and an output terminal of the amplifier circuit and forms a feedback loop;
first and second variable capacitive elements with capacitance values that chance according to a control voltage, respectively connected to the input terminal and the output terminal;
an analog operation circuit that generates a desired control voltage based on an inputted control voltage and applies the desired control voltage to at least one of the first and second variable capacitive elements, wherein the analog operation circuit has a multiplicative gain and generates an offset potential difference; and
a voltage measuring unit operable to measure the respective voltages at the input terminal and the output terminal; and a control unit operable to control the gain and the offset potential difference of the analog operation circuit based on both of the measured voltages.

19. A voltage controlled oscillator comprising:
an amplifier circuit;
a piezoelectric element that is connected between an input terminal and an output terminal of the amplifier circuit and forms a feedback loop;
first and second variable capacitive elements with capacitance values that change according to a control voltage, respectively connected to the input terminal and the output terminal; and
an analog operation circuit that generates a desired control voltage based on an inputted control voltage and applies the desired control voltage to at least one of the first and second variable capacitive elements,
wherein the analog operation circuit has a multiplicative gain and generates an offset potential difference,
wherein the analog operation circuit includes a first analog operation circuit that generates a desired first control voltage based on the inputted control voltage and a second analog operation circuit that generates a desired second control voltage based on the inputted control voltage, and the first control voltage is applied to one of the first and second variable capacitive elements and the second control voltage is applied to the other of the first and second variable capacitive elements, and
wherein when the oscillation amplitude at the input terminal is V3, the oscillation amplitude at the output terminal is V4, a central operating voltage at the input terminal is Vc3, and a central operating voltage at the output terminal is Vc4, a ratio of the gain in the first analog operation circuit and the gain in the second analog operation circuit is V3/V4 and a difference between the offset potential difference of the first analog operation circuit and the offset potential difference in the second analog operation circuit is (Vc3−Vc4).

* * * * *

UNITED STATES PATENT AND TRADEMARK OFFICE
CERTIFICATE OF CORRECTION

| | | |
|---|---|---|
| PATENT NO. | : 7,675,377 B2 | Page 1 of 1 |
| APPLICATION NO. | : 11/918601 | |
| DATED | : March 9, 2010 | |
| INVENTOR(S) | : Tomoaki Yamamoto | |

It is certified that error appears in the above-identified patent and that said Letters Patent is hereby corrected as shown below:

In claim 9, column 21, line 59, "pain" (both occurrences) should read --gain--;

In claim 18, column 23, line 24, "chance" should read --change--.

Signed and Sealed this
First Day of January, 2013

David J. Kappos
*Director of the United States Patent and Trademark Office*